United States Patent
Yamazaki et al.

(10) Patent No.: US 9,852,904 B2
(45) Date of Patent: Dec. 26, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hideomi Suzawa, Atsugi (JP); Shinya Sasagawa, Chigasaki (JP); Tetsuhiro Tanaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/813,413

(22) Filed: Jul. 30, 2015

(65) Prior Publication Data
US 2015/0333160 A1    Nov. 19, 2015

Related U.S. Application Data

(63) Continuation of application No. 14/054,162, filed on Oct. 15, 2013, now Pat. No. 9,153,436.

(30) Foreign Application Priority Data

Oct. 17, 2012  (JP) .................................. 2012-230364

(51) Int. Cl.
*H01L 21/441*   (2006.01)
*H01L 21/4757*  (2006.01)
(Continued)

(52) U.S. Cl.
CPC ...... *H01L 21/02565* (2013.01); *C23C 14/086* (2013.01); *C23C 14/3414* (2013.01);
(Continued)

(58) Field of Classification Search
CPC .......... H01L 21/02414; H01L 29/7869; C23C 14/086
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Song.I et al., "Short Channel Characteristics of Gallium-Indium-Zinc-Oxide Thin Film Transistors for Three-Dimensional Stacking Memory", IEEE Electron Device Letters, Jun. 1, 2008, vol. 29, No. 6, pp. 549-552.

(Continued)

*Primary Examiner* — Moazzam Hossain
(74) *Attorney, Agent, or Firm* — Robinson Intellectual Property Law Office; Eric J. Robinson

(57) ABSTRACT

In a semiconductor device in which a channel formation region is included in an oxide semiconductor layer, an oxide insulating film below and in contact with the oxide semiconductor layer and a gate insulating film over and in contact with the oxide semiconductor layer are used to supply oxygen of the gate insulating film, which is introduced by an ion implantation method, to the oxide semiconductor layer.

8 Claims, 23 Drawing Sheets

(51) Int. Cl.

| | |
|---|---|
| *H01L 21/4763* | (2006.01) |
| *H01L 29/66* | (2006.01) |
| *H01L 29/45* | (2006.01) |
| *H01L 29/786* | (2006.01) |
| *H01L 21/02* | (2006.01) |
| *H01L 29/04* | (2006.01) |
| *H01L 29/26* | (2006.01) |
| *H01L 29/78* | (2006.01) |
| *C23C 14/08* | (2006.01) |
| *C23C 14/34* | (2006.01) |
| *H01L 29/49* | (2006.01) |

(52) U.S. Cl.
CPC .. *H01L 21/02554* (2013.01); *H01L 21/02592* (2013.01); *H01L 21/02609* (2013.01); *H01L 21/02617* (2013.01); *H01L 21/02631* (2013.01); *H01L 21/441* (2013.01); *H01L 21/47576* (2013.01); *H01L 21/47635* (2013.01); *H01L 29/045* (2013.01); *H01L 29/26* (2013.01); *H01L 29/45* (2013.01); *H01L 29/4908* (2013.01); *H01L 29/66969* (2013.01); *H01L 29/78* (2013.01); *H01L 29/7869* (2013.01); *H01L 21/02488* (2013.01)

(58) Field of Classification Search
USPC .......................................................... 438/104
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,741,641 B2 | 6/2010 | Bae et al. |
| 7,791,072 B2 | 9/2010 | Kumomi et al. |
| 8,237,166 B2 | 8/2012 | Kumomi et al. |
| 8,501,564 B2 | 8/2013 | Suzawa et al. |
| 8,502,292 B2 | 8/2013 | Kato et al. |
| 8,546,225 B2 | 10/2013 | Yamazaki |
| 8,551,810 B2 | 10/2013 | Yamazaki |
| 8,551,824 B2 | 10/2013 | Yamazaki et al. |
| 8,633,480 B2 | 1/2014 | Yamazaki et al. |
| 8,748,881 B2 | 6/2014 | Yamazaki |
| 8,779,420 B2 | 7/2014 | Yamazaki |
| 8,823,074 B2 | 9/2014 | Suzawa et al. |
| 8,957,418 B2 | 2/2015 | Moriguchi et al. |
| 9,064,898 B2 | 6/2015 | Yamazaki |
| 9,064,967 B2 | 6/2015 | Suzawa et al. |
| 9,093,544 B2 | 7/2015 | Yamazaki et al. |
| 9,214,520 B2 | 12/2015 | Yamazaki |
| 9,673,336 B2 | 6/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0111144 A1 | 5/2007 | Fujikawa et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0267048 A1* | 10/2009 | Nakahara ................ H01L 33/20 257/13 |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0044864 A1 | 2/2010 | Maekawa et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

(56) References Cited

U.S. PATENT DOCUMENTS

| | | | |
|---|---|---|---|
| 2010/0117075 A1* | 5/2010 | Akimoto | H01L 29/66742 257/43 |
| 2010/0123131 A1* | 5/2010 | Tokunaga | H01L 29/41733 257/43 |
| 2010/0224878 A1 | 9/2010 | Kimura | |
| 2011/0108837 A1 | 5/2011 | Yamazaki et al. | |
| 2011/0114943 A1* | 5/2011 | Yamazaki | H01L 29/45 257/43 |
| 2011/0127523 A1 | 6/2011 | Yamazaki | |
| 2011/0133177 A1 | 6/2011 | Suzawa et al. | |
| 2011/0147738 A1 | 6/2011 | Yamazaki et al. | |
| 2011/0151618 A1* | 6/2011 | Yamazaki | H01L 21/02472 438/104 |
| 2011/0156022 A1 | 6/2011 | Yamazaki et al. | |
| 2011/0180796 A1 | 7/2011 | Yamazaki et al. | |
| 2011/0193080 A1 | 8/2011 | Yamazaki et al. | |
| 2011/0212569 A1 | 9/2011 | Yamazaki et al. | |
| 2011/0237025 A1 | 9/2011 | Yamazaki | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2012/0175625 A1 | 7/2012 | Yamazaki | |
| 2012/0231580 A1 | 9/2012 | Yamazaki et al. | |
| 2013/0140554 A1 | 6/2013 | Yamazaki et al. | |
| 2013/0285054 A1 | 10/2013 | Moriguchi et al. | |
| 2014/0014951 A1* | 1/2014 | Kawashima | H01L 29/41733 257/43 |
| 2014/0038351 A1 | 2/2014 | Yamazaki et al. | |
| 2014/0103337 A1 | 4/2014 | Yamazaki et al. | |
| 2014/0103338 A1 | 4/2014 | Yamazaki et al. | |
| 2014/0103340 A1 | 4/2014 | Yamazaki et al. | |
| 2015/0108467 A1 | 4/2015 | Moriguchi et al. | |
| 2015/0108477 A1 | 4/2015 | Tokunaga | |
| 2015/0287814 A1 | 10/2015 | Yamazaki | |
| 2015/0333089 A1 | 11/2015 | Yamazaki et al. | |
| 2016/0163871 A1 | 6/2016 | Yamazaki | |
| 2017/0179162 A1 | 6/2017 | Moriguchi et al. | |
| 2017/0256646 A1 | 9/2017 | Yamazaki | |

FOREIGN PATENT DOCUMENTS

| | | |
|---|---|---|
| EP | 2657974 A | 10/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-049270 A | 2/1989 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006 165528 A | 6/2006 |
| JP | 2007-073558 A | 3/2007 |
| JP | 2007-073563 A | 3/2007 |
| JP | 2008-060419 A | 3/2008 |
| JP | 2009-224737 A | 10/2009 |
| JP | 2010-062276 A | 3/2010 |
| JP | 2010-073894 A | 4/2010 |
| JP | 2011-119718 A | 6/2011 |
| JP | 2011-135063 A | 7/2011 |
| JP | 2011-139055 A | 7/2011 |
| JP | 2011-199272 A | 10/2011 |
| JP | 2011-222988 A | 11/2011 |
| JP | 2011-243975 A | 12/2011 |
| JP | 2012-039106 A | 2/2012 |
| JP | 2012-160715 A | 8/2012 |
| WO | WO-2004/114391 | 12/2004 |
| WO | WO-2011/055620 | 5/2011 |
| WO | WO-2011/065243 | 6/2011 |
| WO | WO-2011/068028 | 6/2011 |
| WO | WO-2011/105184 | 9/2011 |
| WO | WO-2011/118509 | 9/2011 |
| WO | WO-2011/132591 | 10/2011 |
| WO | WO-2012/008390 | 1/2012 |
| WO | WO-2012/077682 | 6/2012 |
| WO | WO-2012/086513 | 6/2012 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDE '08 : Proceedings of the 15th International Display Workshops, Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letter), Sep. 13, 2004, vol. 85, No. 11, pp. 1993-1995.

(56) References Cited

OTHER PUBLICATIONS

Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '0 9 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-in. AMOLED Display With Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17- 22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.n. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or ZN] at Temperatures over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

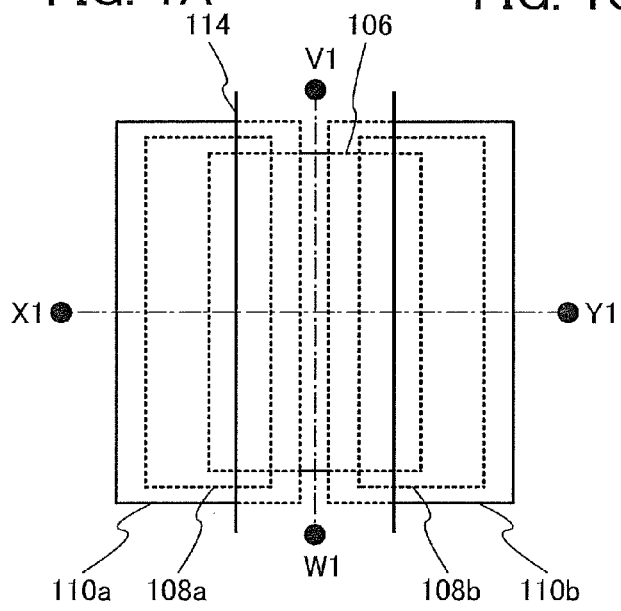
FIG. 1A
FIG. 1B
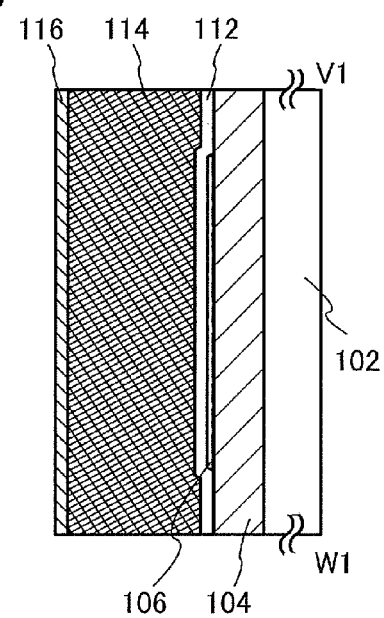
FIG. 1C
FIG. 1D
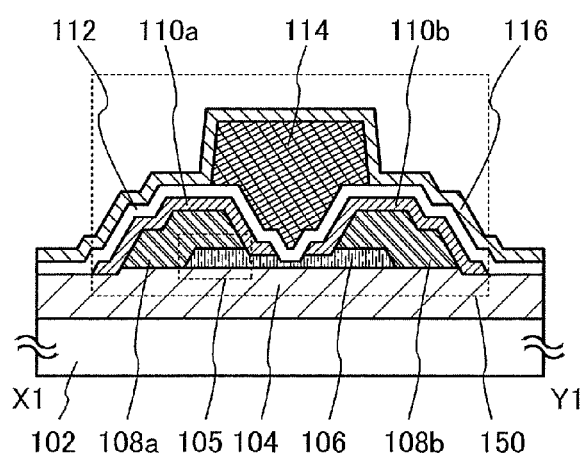
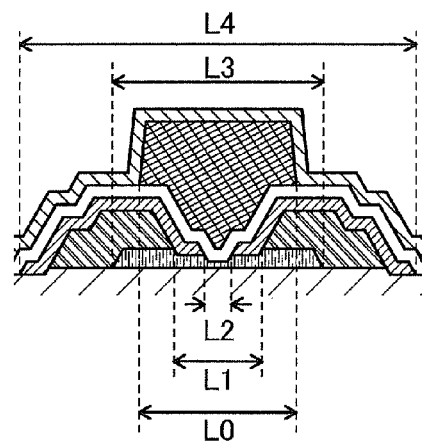
FIG. 1E
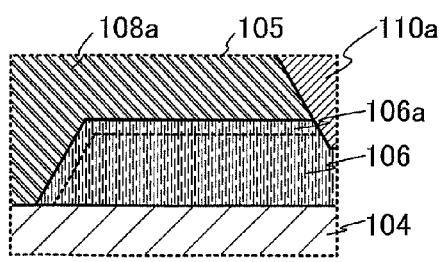

METHOD FOR MANUFACTURING SEMICONDUCTOR DEVICE

BACKGROUND OF THE INVENTION

1. Field of the Invention

The present invention relates to a semiconductor device including an oxide semiconductor and a method for manufacturing the semiconductor device.

In this specification, a "semiconductor device" refers to a device that can function by utilizing semiconductor characteristics; an electro-optical device, a semiconductor circuit, and an electric device are all included in the category of the semiconductor device.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide semiconductor containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

It is known that an oxygen vacancy in an oxide semiconductor becomes a donor; thus, in the case where the oxide semiconductor is used for a channel formation region of a transistor, an oxide semiconductor layer including as few oxygen vacancies as possible is preferably used.

However, even when an oxide semiconductor layer includes few oxygen vacancies initially, oxygen vacancies will increase in number from various causes. An increase in oxygen vacancies in an oxide semiconductor layer causes poor electrical characteristics in some cases; for example, the transistor becomes normally-on, leakage current increases, or threshold voltage is shifted due to stress application.

Thus, an object of one embodiment of the present invention is to provide a semiconductor device in which an increase in oxygen vacancies in an oxide semiconductor layer can be suppressed. Another object is to provide a semiconductor device with favorable electrical characteristics. In addition, another object is to provide a highly reliable semiconductor device.

According to one embodiment of the present invention, in a semiconductor device in which a channel formation region is included in an oxide semiconductor layer, an oxide insulating film below and in contact with the oxide semiconductor layer and a gate insulating film over and in contact with the oxide semiconductor layer are used to supply oxygen of the oxide insulating film or the gate insulating film to the oxide semiconductor layer. Further, a conductive nitride is used for metal films of a source electrode layer and a drain electrode layer, whereby diffusion or transfer of oxygen to the metal films is suppressed. Details thereof will be described below.

One embodiment of the present invention is a method for manufacturing a semiconductor device including a step of forming an oxide semiconductor layer over an oxide insulating film; a step of forming a first source electrode layer and a first drain electrode layer over and in contact with the oxide semiconductor layer; a step of forming a second source electrode layer and a second drain electrode layer to cover the first source electrode layer and the first drain electrode layer and be in contact with the oxide semiconductor layer; a step of forming a gate insulating film over the oxide insulating film, the oxide semiconductor layer, the second source electrode layer, and the second drain electrode layer; a step of introducing oxygen to the gate insulating film; and a step of supplying the oxygen in the gate insulating film to the oxide semiconductor layer.

In the above manufacturing method, as a method for introducing oxygen into the gate insulating film, an ion implantation method or the like may be used. Further, before oxygen is introduced into the gate insulating film, a gate electrode may be formed over the gate insulating film. Alternatively, a gate electrode may be formed over the gate insulating film, and a protective insulating film may be formed over the gate electrode before oxygen is introduced into the gate insulating film, and then oxygen may be introduced into the gate insulating film through the protective insulating film.

A structure obtained by the above method for manufacturing a semiconductor device is also one embodiment of the present invention. The structure of the semiconductor device includes an oxide insulating film; an oxide semiconductor layer over the oxide insulating film; a first source electrode layer and a first drain electrode layer in contact with the oxide semiconductor layer; a second source electrode layer and a second drain electrode layer which cover the first source electrode layer and the first drain electrode layer and are in contact with the oxide semiconductor layer; a gate insulating film over the oxide insulating film, the oxide semiconductor layer, the second source electrode layer, and the second drain electrode layer; a gate electrode layer over the gate insulating film and in a portion overlapping with the oxide semiconductor layer; and a protective insulating film over the gate insulating film and the gate electrode layer. In the semiconductor device, the gate insulating film is partly in contact with the oxide insulating film so as to cover the second source electrode layer and the second drain electrode layer.

Another embodiment of the present invention is a semiconductor device including an oxide insulating film; an oxide semiconductor layer over the oxide insulating film; a first source electrode layer and a first drain electrode layer in contact with the oxide semiconductor layer; a second source electrode layer and a second drain electrode layer in contact with the first source electrode layer and the first drain electrode layer, respectively, and in contact with the oxide semiconductor layer; a gate insulating film over the oxide insulating film, the oxide semiconductor layer, the first source electrode layer, the first drain electrode layer, the second source electrode layer, and the second drain electrode layer; a gate electrode layer over the gate insulating film and in a portion overlapping with the oxide semiconductor layer; and a protective insulating film over the gate insulating film and the gate electrode layer. In the semiconductor device, the gate insulating film is partly in contact with the oxide insulating film so as to cover the first source electrode layer and the first drain electrode layer.

In each of the above structures, the first source electrode layer and the first drain electrode layer are preferably at least one material selected from Al, Cr, Cu, Ta, Ti, Mo, and W or an alloy material containing any of these as a main component.

In each of the above structures, end portions of the first source electrode layer and the first drain electrode layer preferably have a staircase-like shape.

In each of the above structures, the second source electrode layer and the second drain electrode layer are preferably at least one material selected from tantalum nitride, titanium nitride, and ruthenium or an alloy material containing any of these as a main component.

In each of the above structures, the protective insulating film is preferably a silicon nitride film.

In each of the above structures, it is preferable that the oxide semiconductor layer contain a crystalline phase, and a c-axis of the crystalline phase be parallel to a normal vector of a surface of the oxide semiconductor layer.

In one embodiment of the present invention, a semiconductor device in which an increase in oxygen vacancies in an oxide semiconductor layer is suppressed can be provided. Further, a semiconductor device with favorable electrical characteristics can be provided. Further, a highly reliable semiconductor device can be provided.

BRIEF DESCRIPTION OF THE DRAWINGS

FIGS. 1A to 1E are a top view and cross-sectional views which illustrate a semiconductor device.

DETAILED DESCRIPTION OF THE INVENTION

Figure 2A:
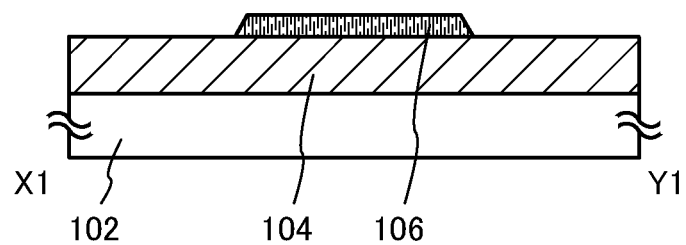
FIGS. 2A to 2D illustrate a method for manufacturing a semiconductor device.

Embodiments and examples are described in detail with reference to the drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments and the examples below. Note that, in the structures of the invention described below, in some cases, the same portions or portions having similar functions are denoted by the same reference numerals in different drawings, and the descriptions of such portions are not repeated.

In this specification, functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

Embodiment 1

In this embodiment, a semiconductor device which is one embodiment of the present invention is described with reference to drawings.

FIGS. 1A, 1B, 1C, 1D, and 1E are a top view and cross-sectional views which illustrate a transistor of one embodiment of the present invention. FIG. 1A is the top view of the transistor, and a cross section taken along a dashed-dotted line X1-Y1 in FIG. 1A is illustrated in FIG. 1B. A cross section taken along a dashed-dotted line V1-W1 in FIG. 1A is illustrated in FIG. 1C. FIG. 1D illustrates widths of components of the transistor which are illustrated in FIG. 1B. FIG. 1E is an enlarged view of a region 105 illustrated in FIG. 1B. Note that for simplification of the drawing, some components in the top view in FIG. 1A are illustrated in a see-through manner or not illustrated.

A transistor 150 illustrated in FIGS. 1A, 1B, 1C, 1D, and 1E includes an oxide insulating film 104 formed over a substrate 102; an oxide semiconductor layer 106 formed over the oxide insulating film 104; a first source electrode layer 108a and a first drain electrode layer 108b formed over the oxide semiconductor layer 106; a second source electrode layer 110a and a second drain electrode layer 110b formed over the first source electrode layer 108a and the first drain electrode layer 108b, respectively; a gate insulating film 112 formed over the oxide insulating film 104, the oxide semiconductor layer 106, the second source electrode layer 110a, and the second drain electrode layer 110b; a gate electrode layer 114 formed over the gate insulating film 112 and in a position overlapping with the oxide semiconductor layer 106; and a protective insulating film 116 formed over the gate insulating film 112 and the gate electrode layer 114. Note that another insulating layer, another wiring, or the like may be formed over the protective insulating film 116.

The substrate 102 is not limited to a simple supporting substrate, and may be a substrate where another device such as a transistor is formed. In that case, at least one of the gate electrode layer 114, the first source electrode layer 108a, the first drain electrode layer 108b, the second source electrode layer 110a, and the second drain electrode layer 110b of the transistor 150 may be electrically connected to the above device.

The oxide insulating film 104 can have a function of supplying oxygen to the oxide semiconductor layer 106 as well as a function of preventing diffusion of an impurity from the substrate 102; thus, the oxide insulating film 104 is an insulating film containing oxygen. It is particularly preferable that the oxide insulating film 104 be an insulating film containing excess oxygen. An oxide insulating film containing excess oxygen refers to an oxide insulating film from which oxygen can be released by heat treatment or the like. The oxide insulating film containing excess oxygen is preferably a film in which the amount of released oxygen when converted into oxygen atoms is $1.0 \times 10^{19}$ atoms/cm$^3$ or more in thermal desorption spectroscopy analysis. Further, excess oxygen refers to oxygen which can be transferred in the oxide semiconductor layer, silicon oxide, or silicon oxynitride by heat treatment, oxygen in excess of an intrinsic stoichiometric composition, or oxygen which can fill Vo (oxygen vacancy) caused by lack of oxygen. Oxygen released from the oxide insulating film 104 can be diffused to a channel formation region of the oxide semiconductor layer 106, so that oxygen vacancies which might be formed in the oxide semiconductor layer can be filled with the oxygen. In this manner, stable electrical characteristics of the transistor can be achieved.

Since the oxide insulating film 104 is provided in contact with the oxide semiconductor layer 106, oxygen can be directly diffused to the oxide semiconductor layer 106 from a lower side of the oxide semiconductor layer 106. Moreover, since the oxide insulating film 104 is provided in contact with the gate insulating film 112, oxygen can be diffused to the oxide semiconductor layer 106 from an upper side of the oxide semiconductor layer 106 through the gate insulating film 112.

Further, oxygen is introduced into the gate insulating film 112 by an ion implantation method and diffused to the oxide semiconductor layer 106 to the gate insulating film 112.

More specifically, oxygen released from the oxide insulating film 104 can enter the upper side region of the oxide semiconductor layer 106, which serves as a channel, by being transferred from the outside of the second source electrode layer 110a (the left side in FIG. 1B) and the outside of the second drain electrode layer 110b (the right side in FIG. 1B) through the gate insulating film 112. In other words, the gate insulating film 112 is partly in contact with the oxide insulating film 104 so as to cover the second source electrode layer 110a and the second drain electrode layer 110b.

Thus, the gate insulating film 112 is provided between the protective insulating film 116, and the second source electrode layer 110a and the second drain electrode layer 110b so that oxygen released from the oxide insulating film 104 can be diffused to the channel formation region in the oxide semiconductor layer 106. Accordingly, a material to which little oxygen is diffused or transferred is used for the second source electrode layer 110a, the second drain electrode layer 110b, and the protective insulating film 116. In this manner, when oxygen is diffused to the oxide semiconductor layer through the gate insulating film, diffusion or transfer of oxygen to the source electrode layer and the drain electrode layer can be suppressed.

In a transistor having such a structure, excess oxygen can be supplied from the oxide insulating film 104 and the gate insulating film 112 to the channel formation region of the oxide semiconductor layer 106, whereby the transistor including the oxide semiconductor layer 106 has normally-off characteristics with a positive threshold voltage. Thus, it is possible to provide a semiconductor device in which an increase in oxygen vacancies in the oxide semiconductor layer 106 is suppressed. Further, a highly reliable semiconductor device can be provided.

Note that in the case where the substrate 102 is a substrate where another device is formed, the oxide insulating film 104 also has a function as an interlayer insulating film. In that case, the oxide insulating film 104 is preferably subjected to planarization treatment such as chemical mechanical polishing (CMP) treatment so as to have a flat surface.

An oxide semiconductor that can be used for the oxide semiconductor layer 106 preferably contains at least indium (In) or zinc (Zn). Alternatively, the oxide semiconductor preferably contains both In and Zn. Details of a material and a formation method which can be used for the oxide semiconductor layer 106 are to be described in description of a method for manufacturing the transistor.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/\text{cm}^3$, preferably lower than $1 \times 10^{15}/\text{cm}^3$, further preferably lower than $1 \times 10^{13}/\text{cm}^3$.

Further, in an oxide semiconductor layer, hydrogen, nitrogen, carbon, silicon, and metal elements except main components of the oxide semiconductor are impurities. For example, hydrogen and nitrogen form donor levels to increase the carrier density. Silicon forms impurity levels in an oxide semiconductor layer. The impurity levels serve as traps and might cause electrical characteristics of the transistor to deteriorate.

An oxide semiconductor layer can be intrinsic or substantially intrinsic under the following conditions: in SIMS analysis, the concentration of silicon is lower than $1 \times 10^{19}$ atoms/cm$^3$, preferably lower than $5 \times 10^{18}$ atoms/cm$^3$, further preferably lower than $1 \times 10^{18}$ atoms/cm$^3$; the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$; and the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer.

The crystallinity of the oxide semiconductor layer can be prevented from decreasing when the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$, and the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor film is used for a channel formation region as described above has extremely low off-state current, and the off-state current standardized on the channel width of the transistor can be as low as several yoktoamperes per micrometer to several zeptoamperes per micrometer.

When the density of localized states in the film of the oxide semiconductor which can be used for the oxide semiconductor layer 106 is reduced, stable electrical characteristics can be imparted to the transistor including the oxide semiconductor layer 106. Note that to impart stable electrical characteristics to the transistor, the absorption coefficient due to the localized states in the oxide semiconductor layer 106, which is obtained in measurement by a constant photocurrent method (CPM), is set lower than $1\times10^{-3}$/cm, preferably lower than $3\times10^{-4}$/cm.

For the first source electrode layer 108a and the first drain electrode layer 108b, a conductive material which is easily bonded to oxygen can be used. For example, Al, Cr, Cu, Ta, Ti, Mo, or W can be used. In particular, W with a high melting point is preferably used, which allows subsequent process temperatures to be relatively high. Note that the conductive material which is easily bonded to oxygen includes, in its category, a material to which oxygen is easily diffused or transferred.

When the conductive material which is easily bonded to oxygen is in contact with an oxide semiconductor layer, a phenomenon occurs in which oxygen of the oxide semiconductor layer is diffused or transferred to the conductive material which is easily bonded to oxygen. Since the manufacturing process of the transistor involves some heat treatment steps, the above phenomenon causes generation of oxygen vacancies in a region of the oxide semiconductor layer, which is in contact with the source electrode or the drain electrode, and the region becomes an n-type. Thus, the n-type region can serve as a source or a drain of the transistor.

However, in the case of forming a transistor with an extremely short channel length, the n-type region which is formed by the generation of the oxygen vacancies sometimes extends in the channel length direction of the transistor. In that case, electrical characteristics of the transistor change; for example, the threshold voltage is shifted or on and off of the transistor cannot be controlled with the gate voltage (i.e., the transistor is on). Accordingly, when a transistor with an extremely short channel length is formed, it is not preferable that the conductive material which is easily bonded to oxygen be used for a source electrode and a drain electrode.

Thus, in one embodiment of the present invention, the source electrode and the drain electrode have stacked-layer structures, and the second source electrode layer 110a and the second drain electrode layer 110b, which determine the channel length, are formed using the conductive material which is not easily bonded to oxygen. As the conductive material, for example, a conductive nitride such as tantalum nitride or titanium nitride, or ruthenium is preferably used. Note that the conductive material which is not easily bonded to oxygen includes, in its category, a material to which oxygen is not easily diffused or transferred.

Note that in the transistor having the structure illustrated in FIGS. 1A to 1E, the channel length refers to a distance between the second source electrode layer 110a and the second drain electrode layer 110b.

By the use of the above conductive material which is not easily bonded to oxygen for the second source electrode layer 110a and the second drain electrode layer 110b, generation of oxygen vacancies in the channel formation region of the oxide semiconductor layer 106 can be suppressed, so that change of the channel into an n-type can be suppressed. In this manner, even a transistor with an extremely short channel length can have favorable electrical characteristics.

In the case where the source electrode and the drain electrode are formed using only the above conductive material which is not easily bonded to oxygen, the contact resistance with the oxide semiconductor layer 106 becomes too high; thus, it is preferable that as illustrated in FIG. 1B, the first source electrode layer 108a and the first drain electrode layer 108b be formed over the oxide semiconductor layer 106 and the second source electrode layer 110a and the second drain electrode layer 110b be formed so as to cover the first source electrode layer 108a and the first drain electrode layer 108b.

At this time, it is preferable that the oxide semiconductor layer 106 have a large contact area with the first source electrode layer 108a or the first drain electrode layer 108b, and the oxide semiconductor layer 106 have a small contact area with the second source electrode layer 110a or the second drain electrode layer 110b. The region of the oxide semiconductor layer 106, which is in contact with the first source electrode layer 108a or the first drain electrode layer 108b, becomes an n-type region due to generation of oxygen vacancies. Owing to the n-type region, the contact resistance between the oxide semiconductor layer 106 and the first source electrode layer 108a or the first drain electrode layer 108b can be reduced. Accordingly, when the oxide semiconductor layer 106 has a large contact area with the first source electrode layer 108a or the first drain electrode layer 108b, the area of the n-type region can also be large.

Here, the above-mentioned n-type region is described with reference to FIG. 1E. FIG. 1E is an enlarged view of a region 105 illustrated in FIG. 1B, and in the region of the oxide semiconductor layer 106, which is in contact with the first source electrode layer 108a, oxygen of the oxide semiconductor layer 106 is extracted to the first source electrode layer 108a side, so that an n-type region 106a is formed. Note that the n-type region 106a is a region of the oxide semiconductor layer 106, which includes many oxygen vacancies. Moreover, a component of the first source electrode layer 108a, for example, a tungsten element in the case where a tungsten film is used for the first source electrode layer 108a, enters the n-type region 106a. In addition, although not illustrated, a mixed layer might be formed due to entry of oxygen of the oxide semiconductor layer 106 into a region of the first source electrode layer 108a, which is in contact with the oxide semiconductor layer 106.

Note that although the region 105 has been described with reference to the enlarged view illustrating the oxide semiconductor layer 106 and the first source electrode layer 108a, the above-described n-type region is also formed on the first drain electrode layer 108b side of the oxide semiconductor layer 106.

Note that the n-type region 106a may be used as a source region or a drain region in the oxide semiconductor layer 106.

Further, the conductive material which is not easily bonded to oxygen is used for the second source electrode layer 110a and the second drain electrode layer 110b. Thus, when the oxide semiconductor layer 106 is supplied with oxygen of the oxide insulating film 104 from the upper side of the oxide semiconductor layer 106 through the gate insulating film 112, the oxygen is less likely to be diffused or transferred to the second source electrode layer 110a and the second drain electrode layer 110b. Accordingly, oxygen can be favorably supplied to the oxide semiconductor layer 106.

The gate insulating film 112 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 112 may be a stack of any of the above materials.

For the gate electrode layer 114, a conductive film including a material such as Al, Ti, Cr, Co, Ni, Cu, Y, Zr, Mo, Ru, Ag, Ta, or W can be used. Further, the gate electrode layer 114 may be a stack of any of the above materials.

It is preferable that a material to which little oxygen is diffused or transferred be used for the protective insulating film 116. Further, a material containing little hydrogen when formed into a film is preferably used for the protective insulating film 116. The hydrogen content of the protective insulating film 116 is preferably lower than $5 \times 10^{19}/cm^3$, further preferably lower than $5 \times 10^{18}/cm^3$. When the hydrogen content of the protective insulating film 116 has the above value, off-state current of the transistor can be low. For example, a silicon nitride film or a silicon nitride oxide film is preferably used as the protective insulating film 116.

Here, distances between the components are described with reference to the cross-sectional view in FIG. 1D.

The distance (L1) between the first source electrode layer 108a and the first drain electrode layer 108b is set to 0.8 μm or longer, preferably 1.0 μm or longer. In the case where L1 is shorter than 0.8 μm, influence of oxygen vacancies generated in the channel formation region cannot be eliminated, which might cause deterioration of the electrical characteristics of the transistor.

Even when the distance (L2) between the second source electrode layer 110a and the second drain electrode layer 110b is shorter than L1, for example, 30 nm or shorter, the transistor can have favorable electrical characteristics.

Further, when the width of the gate electrode layer 114 is referred to as L0, L0≥L1≥L2 (L1 is longer than or equal to L2 and shorter than or equal to L0) is satisfied as illustrated in FIG. 1D so that regions can be formed in which the gate electrode layer 114 overlaps with the source and drain electrode layers (the first source electrode layer 108a, the second source electrode layer 110a, the first drain electrode layer 108b, and the second drain electrode layer 110b) with the gate insulating film 112 provided therebetween. With use of such a structure, on-state characteristics (e.g., on-state current and field-effect mobility) of a miniaturized transistor can be improved.

When the width of the oxide semiconductor layer 106 is referred to as L3 and the width of the transistor 150 is referred to as L4, L3 is preferably shorter than 1 μm and L4 is preferably longer than or equal to 1 μm and shorter than or equal to 2.5 μm. When L3 and L4 have the respective values, the transistor can be miniaturized.

The above is the transistor of one embodiment of the present invention, whose structure can suppress an increase in oxygen vacancies in the oxide semiconductor layer. Specifically, in the transistor, oxygen can be supplied from the oxide insulating film and the gate insulating film, which are in contact with the oxide semiconductor layer, to the oxide semiconductor layer. It is thus possible to provide a semiconductor device having favorable electrical characteristics and high long-term reliability.

Note that this embodiment can be combined as appropriate with any of the other embodiments and examples in this specification.

Embodiment 2

In this embodiment, a method for manufacturing the transistor 150 described in Embodiment 1 with reference to FIGS. 1A to 1E will be described with reference to FIGS. 2A to 2D, FIGS. 3A to 3D, and FIGS. 4A to 4C.

For the substrate 102, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The oxide insulating film 104 can be formed by a plasma chemical vapor deposition (CVD) method, a sputtering method, or the like using an oxide insulating film of aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like or a mixed material of any of these. Further, a stack of any of the above materials may be used, and at least an upper layer of the oxide insulating film 104, which is in contact with the oxide semiconductor layer 106, is formed using a material containing oxygen which might serve as a supply source of oxygen to the oxide semiconductor layer 106.

Oxygen may be added to the oxide insulating film 104 by an ion implantation method, an ion doping method, a plasma immersion ion implantation method, or the like. By addition of oxygen, the oxide insulating film 104 can further contain excess oxygen.

Then, an oxide semiconductor layer is formed over the oxide insulating film 104 by a sputtering method, a CVD method, a molecular beam epitaxy (MBE) method, an atomic layer deposition (ALD) method, or a pulse laser deposition (PLD) method and selectively etched, so that the oxide semiconductor layer 106 is formed (see FIG. 2A). Note that heating may be performed before etching.

An oxide semiconductor that can be used for the oxide semiconductor layer 106 preferably contains at least indium (In) or zinc (Zn). Alternatively, the oxide semiconductor preferably contains both In and Zn. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that an In—Ga—Zn oxide refers to, for example, an oxide containing In, Ga, and Zn as its main components and there is no particular limitation on the ratio of In to Ga and Zn. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that the oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

As the oxide semiconductor film, a film in a single crystal state, a polycrystalline (also referred to as polycrystal) state, an amorphous state, or the like can be used. The oxide semiconductor film is preferably a c-axis aligned crystalline oxide semiconductor (CAAC-OS) film.

Sputtering may be performed to form an oxide semiconductor film including a CAAC-OS film. In order to obtain a CAAC-OS film by sputtering, it is important to form crystals in a hexagonal configuration in an initial stage of deposition of an oxide semiconductor film and to cause crystal growth from the crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

The CAAC-OS film is one of oxide semiconductor films having a plurality of c-axis aligned crystal parts. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur. According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of c-axis aligned crystal parts is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light is small. Thus, the transistor has high reliability.

For example, a CAAC-OS film can be deposited by a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being distorted by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the sputtering target that is formed.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate released oxygen. By the first heat treatment, the crystallinity of the oxide semiconductor layer 106 can be improved, and in addition, impurities such as hydrogen and water can be removed from the oxide insulating film 104 and the oxide semiconductor layer 106. Note that the step of the first heat treatment may be performed before etching for formation of the oxide semiconductor layer 106.

Figure 2B:
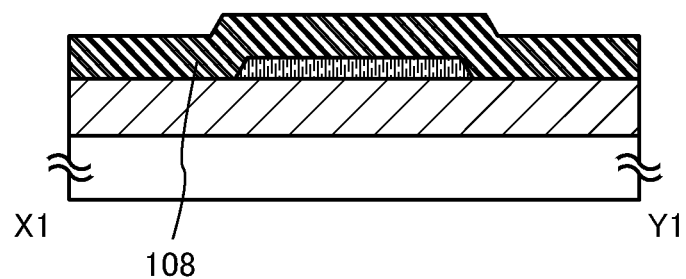

Then, a first conductive film 108 to be the first source electrode layer 108a and the first drain electrode layer 108b is formed over the oxide semiconductor layer 106 (see FIG. 2B). For the first conductive film 108, Al, Cr, Cu, Ta, Ti, Mo, W, or an alloy material containing any of these as a main component can be used. For example, a 100-nm-thick tungsten film is formed by a sputtering method or the like.

Figure 2C:
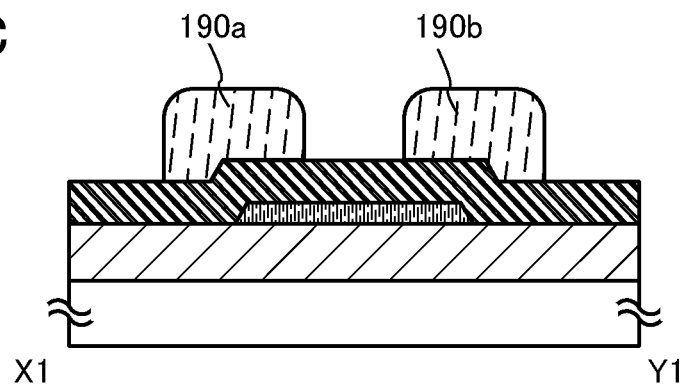

Next, resist masks 190a and 190b are formed over the first conductive film 108 (see FIG. 2C).

Figure 2D:
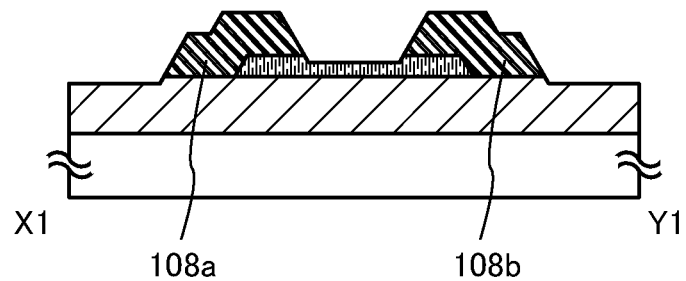

After that, the first conductive film 108 is etched so as to be divided over the oxide semiconductor layer 106 with use of the resist masks 190a and 190b as masks, so that the first source electrode layer 108a and the first drain electrode layer 108b are formed; then, the resist masks 190a and 190b are removed (see FIG. 2D).

At this time, the first conductive film 108 is over-etched, so that the oxide semiconductor layer 106 is partly etched as illustrated in FIG. 2D. However, when the etching selectivity of the first conductive film 108 to the oxide semiconductor layer 106 is high, the oxide semiconductor layer 106 is hardly etched.

In addition, by over-etching the first conductive film 108, part of the oxide insulating film 104, more specifically, the oxide insulating film 104 on outer sides than the edges of the first source electrode layer 108a and the first drain electrode layer 108b is etched as illustrated in FIG. 2D.

Figure 3A:
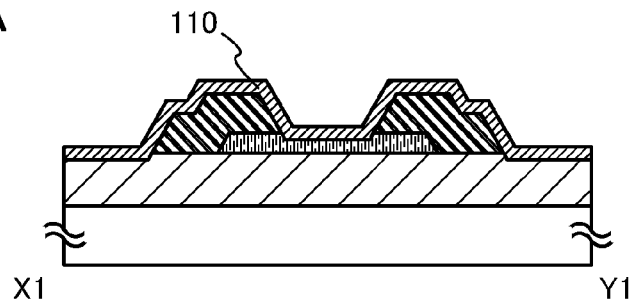
FIGS. 3A to 3D illustrate a method for manufacturing a semiconductor device.

Then, a second conductive film 110 that is to be the second source electrode layer 110a and the second drain electrode layer 110b is formed over the oxide semiconductor layer 106, the first source electrode layer 108a, and the first drain electrode layer 108b (see FIG. 3A). For the second conductive film 110, a conductive nitride such as tantalum nitride or titanium nitride, ruthenium, or an alloy material containing any of these as a main component can be used. For example, a 20-nm-thick tantalum nitride film is formed by a sputtering method or the like.

Figure 3B:
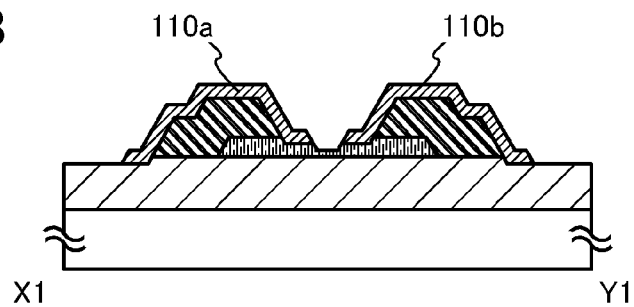

Next, the second conductive film 110 is etched so as to be divided, so that the second source electrode layer 110a and the second drain electrode layer 110b are formed (see FIG. 3B). At this time, as illustrated in FIG. 3B, part of the oxide semiconductor layer 106 may be etched. Although not illustrated, at the time of etching for formation of the second source electrode layer 110a and the second drain electrode layer 110b, part of the oxide insulating film 104, more specifically, the oxide insulating film 104 on outer sides than the edges of the second source electrode layer 110a and the second drain electrode layer 110b may be etched.

Note that in the case of forming a transistor whose channel length (a distance between the second source electrode layer 110a and the second drain electrode layer 110b) is extremely short, the second source electrode layer 110a and the second drain electrode layer 110b can be formed in such a manner that the second conductive film 110 is etched first so as to cover the first source electrode layer 108a and the first drain electrode layer 108b, and then etched using resist masks that are processed by a method suitable for fine line processing, such as electron beam exposure. Note that by use of a positive type resist for the resist masks, the exposed region can be minimized and throughput can be thus improved. In the above manner, a transistor having a channel length of 30 nm or less can be formed.

Next, second heat treatment is preferably performed. The second heat treatment can be performed under a condition similar to that of the first heat treatment. By the second heat treatment, impurities such as hydrogen and water can be further removed from the oxide semiconductor layer 106.

Next, the gate insulating film 112 is formed over the oxide insulating film 104, the oxide semiconductor layer 106, the second source electrode layer 110a, and the second drain electrode layer 110b. The gate insulating film 112 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 112 may be a stack of any of the above materials. The gate insulating film 112 can be formed by a sputtering method, a CVD method, an MBE method, an ALD method, a PLD method, or the like.

It is preferable that the gate insulating film 112 be successively subjected to heat treatment after being formed. For example, the gate insulating film 112 is formed with a PE-CVD apparatus and is successively subjected to heat treatment in a vacuum. The heat treatment can remove hydrogen, moisture, and the like from the gate insulating film 112. By the heat treatment, the gate insulating film 112 can be dehydrated or dehydrogenated to be dense.

Figure 3C:
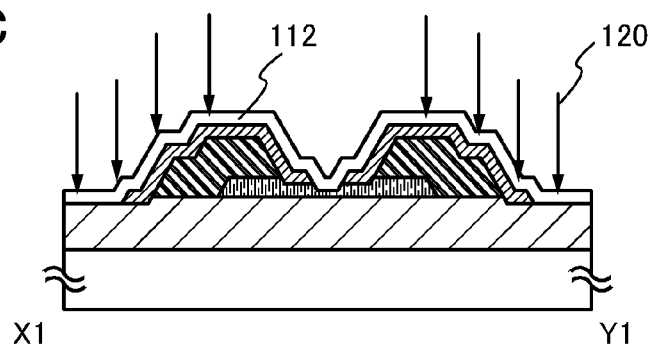

After the heat treatment, oxygen is added into the gate insulating film 112 by an ion implantation method, an ion doping method, a plasma immersion ion implantation method, or the like (see FIG. 3C). By addition of oxygen, the gate insulating film 112 can contain excess oxygen. FIG. 3C is a schematic view which illustrates addition of oxygen 120 into the gate insulating film 112. The oxygen 120 contains at least any of an oxygen radical, ozone, an oxygen atom, and an oxygen ion (including an oxygen molecular ion or an oxygen cluster ion). Note that there is not particular restriction of a timing of the step of adding oxygen into the gate insulating film 112 as long as the step is performed after the formation of the gate insulating film 112, and the step may be performed after formation of a gate electrode or after formation of a protective insulating film.

Figure 3D:
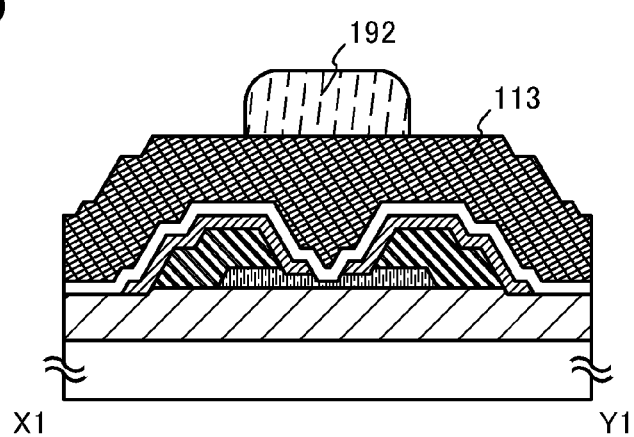

Next, a third conductive film 113 that is to be the gate electrode layer 114 is formed over the gate insulating film 112, and then a resist mask 192 is formed in a desired region (see FIG. 3D). For the third conductive film 113, Al, Ti, Cr, Co, Ni, Cu, Y, Zr, Mo, Ru, Ag, Ta, W, or an alloy material containing any of these as a main component can be used. The third conductive film 113 can be formed by a sputtering method.

Figure 4A:
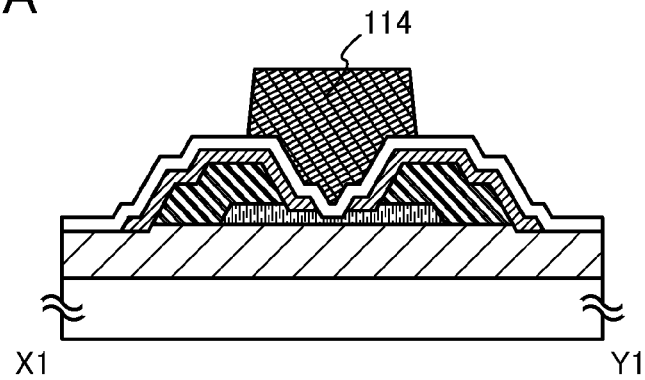
FIGS. 4A to 4C illustrate a method for manufacturing a semiconductor device.

Then, the third conductive film 113 is etched, so that the gate electrode layer 114 is formed; then, the resist mask 192 is removed (see FIG. 4A).

Next, the protective insulating film 116 is formed over the gate insulating film 112 and the gate electrode layer 114. It is preferable that a material to which little oxygen is diffused or transferred be used for the protective insulating film 116. Further, a material containing little hydrogen when formed into a film is preferably used for the protective insulating film 116. The hydrogen content of the protective insulating film 116 is preferably lower than $5 \times 10^{19}/cm^3$, further preferably lower than $5 \times 10^{18}/cm^3$. When the hydrogen content of the protective insulating film 116 has the above value, off-state current of the transistor can be low.

For example, a silicon nitride film or a silicon nitride oxide film is preferably used as the protective insulating film 116. The protective insulating film 116 can be formed by a sputtering method, a CVD method, an MBE method, an ALD method, or a PLD method. In particular, for the protective insulating film 116, a silicon nitride film is preferably formed by a sputtering method, in which case the content of water or hydrogen is low.

Figure 4B:
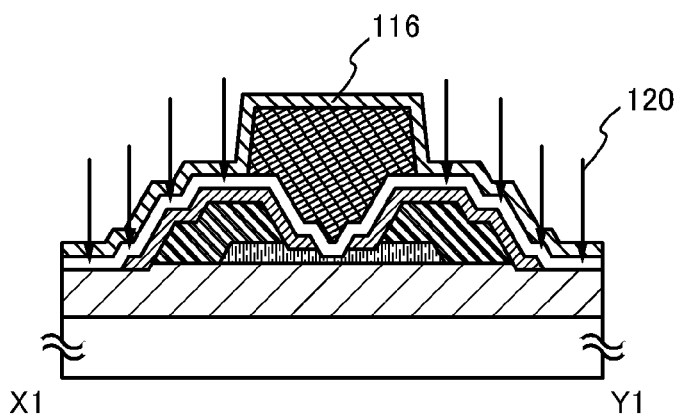
Figure 4C:
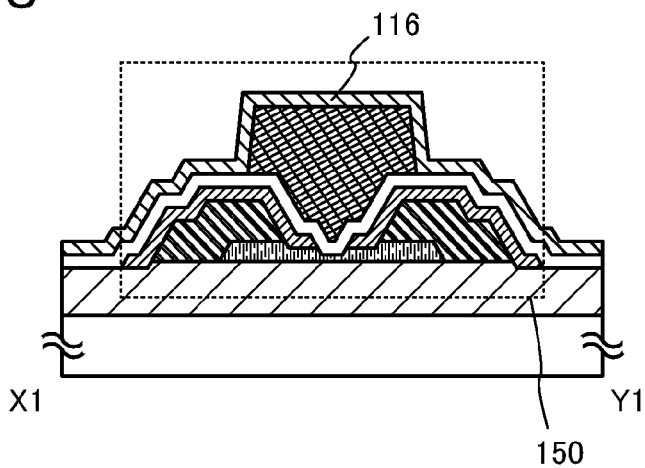

After the protective insulating film 116 is formed, the oxygen 120 is added to the gate insulating film 112 by an ion implantation method, an ion doping method, a plasma immersion ion implantation method, or the like (see FIG. 4B). Addition of the oxygen in this step is performed through the protective insulating film 116. Further, the number of times of the step of adding oxygen is not particularly limited as long as the step is performed after formation of the gate insulating film 112, and the step may be performed after formation of the gate electrode layer 114, and further performed after formation of the protective insulating film 116.

Further, addition of oxygen is not necessarily performed twice (one is performed after the formation of the gate insulating film 112 and the other is performed after formation of the protective insulating film 116), and either one of the steps may be performed.

Oxygen may be added to the entire surface of the substrate at a time. Alternatively, a linear ion beam may be used, for example. In the case of using the linear ion beam, the substrate or the ion beam is relatively moved (scanned), whereby the oxygen 120 can be introduced into the entire area of the gate insulating film 112.

As a supply gas of the oxygen 120, a gas containing oxygen (O) can be used; for example, an $O_2$ gas, an $N_2O$ gas, a $CO_2$ gas, a CO gas, or an $NO_2$ gas can be used. Note that a rare gas (e.g., an Ar gas) may be contained in the supply gas of the oxygen.

In the case where oxygen is added by, for example, an ion implantation method, the dose of the oxygen 120 is preferably greater than or equal to $1 \times 10^{13}$ ions/cm² and less than or equal to $5 \times 10^{16}$ ions/cm². For example, in the case where silicon oxide whose composition is represented by $SiO_x$ (x>0) is used, since a single crystal of silicon oxide is $SiO_2$, x in the insulating film containing excess oxygen is preferably greater than 2. Note that such a region containing oxygen in excess of the stoichiometric composition may exist in part of the gate insulating film 112. The depth at which oxygen is introduced may be adjusted as appropriate by implantation conditions.

Next, third heat treatment is preferably performed. The third heat treatment can be performed under a condition similar to that of the first heat treatment. By the third heat treatment, oxygen is easily released from the oxide insulating film 104 and the gate insulating film 112, so that oxygen vacancies in the oxide semiconductor layer 106 can be reduced.

Through the above steps, the transistor 150 illustrated in FIGS. 1A to 1E and FIG. 4C can be manufactured.

Note that this embodiment can be combined as appropriate with any of the other embodiments and examples in this specification.

Embodiment 3

In this embodiment, a transistor having a structure different from that of the transistor described in Embodiment 1 will be described with reference to FIGS. 5A to 5C and FIGS. 6A to 6D.

Figure 5A:
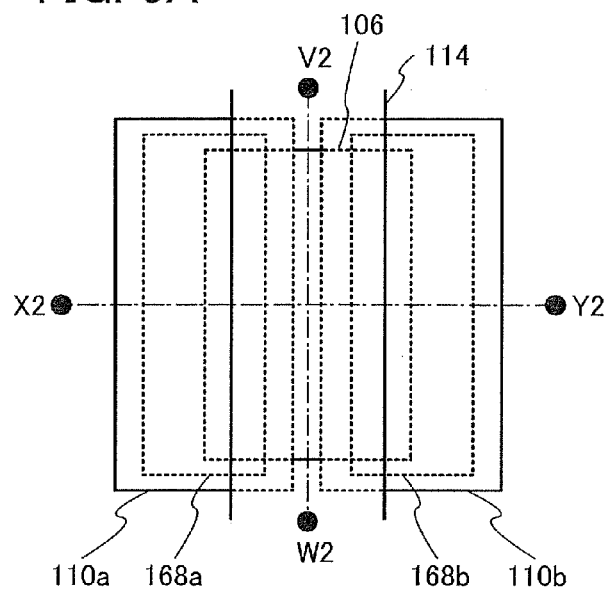
FIGS. 5A to 5C are a top view and cross-sectional views which illustrate a semiconductor device.
Figure 5C:
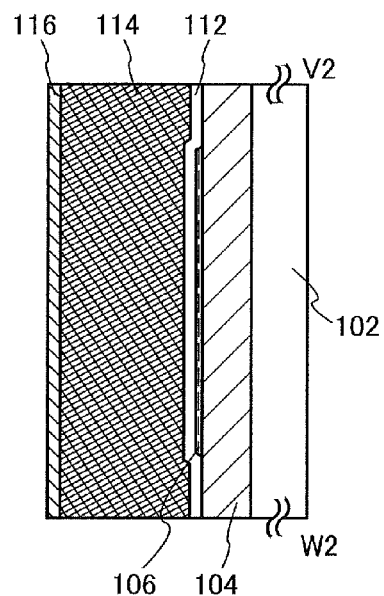
Figure 5B:
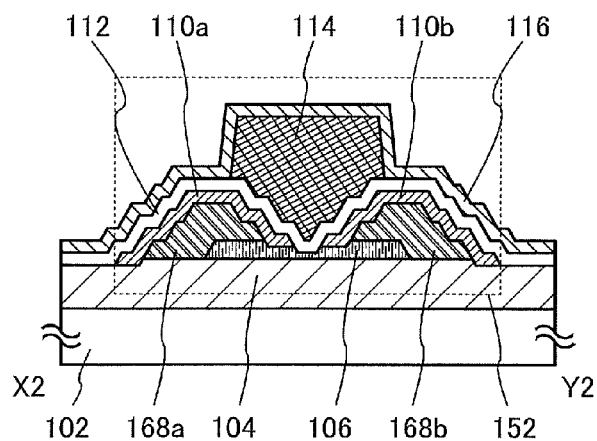

FIGS. 5A, 5B, and 5C are a top view and cross-sectional views which illustrate a transistor of one embodiment of the present invention. FIG. 5A is the top view of the transistor, and a cross section taken along a dashed-dotted line X2-Y2 in FIG. 5A is illustrated in FIG. 5B. A cross section taken along a dashed-dotted line V2-W2 in FIG. 5A is illustrated in FIG. 5C. Note that for simplification of the drawing, some components in the top view in FIG. 5A are illustrated in a see-through manner or not illustrated. Note that the same portions as or portions having functions similar to those of the transistor described in Embodiment 1 are denoted by the same reference numerals, and repeated description thereof is omitted.

A transistor 152 illustrated in FIGS. 5A, 5B, and 5C includes the oxide insulating film 104 formed over the substrate 102; the oxide semiconductor layer 106 formed over the oxide insulating film 104; a first source electrode layer 168a and a first drain electrode layer 168b formed over the oxide semiconductor layer 106; the second source electrode layer 110a and the second drain electrode layer 110b formed over the first source electrode layer 168a and the first drain electrode layer 168b, respectively; the gate insulating film 112 formed over the oxide insulating film 104, the oxide semiconductor layer 106, the second source electrode layer 110a, and the second drain electrode layer 110b; the gate electrode layer 114 formed over the gate insulating film 112 and in a position overlapping with the oxide semiconductor layer 106; and the protective insulating film 116 formed over the gate insulating film 112 and the gate electrode layer 114. Note that another insulating layer, another wiring, or the like may be formed over the protective insulating film 116.

The transistor 152 described in this embodiment is different from the transistor 150 described in Embodiment 1 in the shapes of the first source electrode layer 168a and the first drain electrode layer 168b. Note that the second source electrode layer 110a, the second drain electrode layer 110b, the gate insulating film 112, the gate electrode layer 114, and the protective insulating film 116 which are formed over the first source electrode layer 168a and the first drain electrode layer 168b have shapes corresponding to the shapes of the first source electrode layer 168a and the first drain electrode layer 168b.

With the staircase-like shapes of the first source electrode layer 168a and the first drain electrode layer 168b as illustrated in FIG. 5B, the second source electrode layer 110a, the second drain electrode layer 110b, and the gate insulating film 112 can have favorable coverage. When the gate insulating film 112 has favorable coverage, oxygen released from the oxide insulating film 104 is likely to be diffused to an upper region of the oxide semiconductor layer 106, which serves as a channel, through the gate insulating film 112.

Here, a method for manufacturing the transistor 152 will be described with reference to FIGS. 6A to 6D.

Figure 6A:
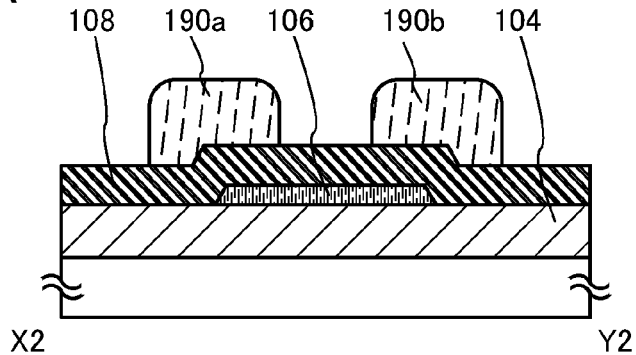
FIGS. 6A to 6D illustrate a method for manufacturing a semiconductor device.

In the manufacturing process of the transistor 152, steps before FIG. 6A are performed in a manner similar to those up to FIG. 2C in the manufacturing process of the transistor 150 (see FIG. 6A). Note that the cross-sectional structure illustrated in FIG. 6A is the same as that illustrated in FIG. 2C.

Figure 6B:
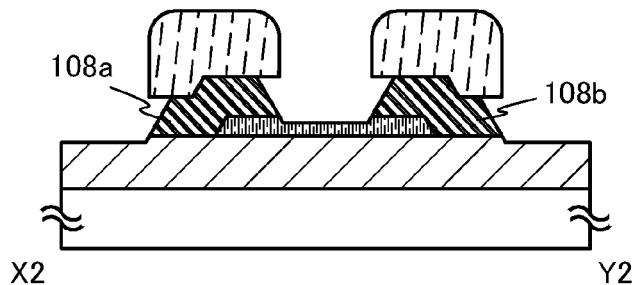

Next, the first conductive film 108 is etched using the resist masks 190a and 190b to form the first source electrode layer 108a and the first drain electrode layer 108b (see FIG. 6B).

Figure 6C:
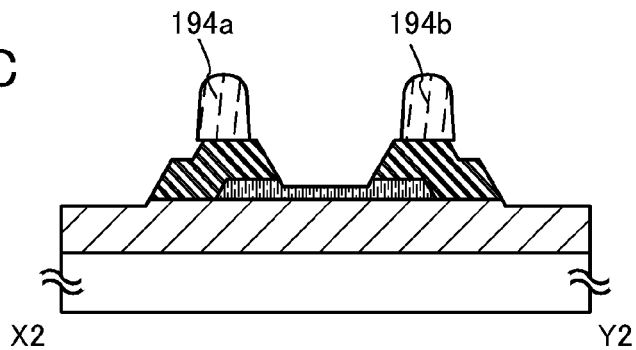

Next, resist masks 194a and 194b are formed by making the resist masks 190a and 190b recede or reducing them by ashing (see FIG. 6C).

Figure 6D:
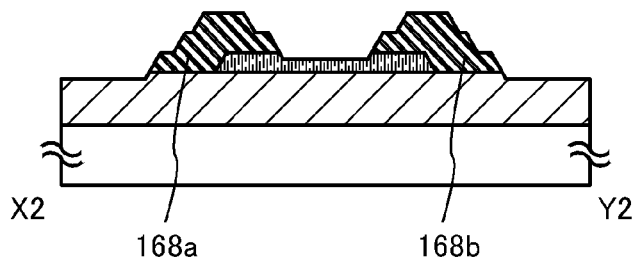

Next, the first source electrode layer 108a and the first drain electrode layer 108b are etched using the resist masks 194a and 194b and then the resist masks 194a and 194b are removed, whereby the first source electrode layer 168a and the first drain electrode layer 168b are formed (see FIG. 6D).

By alternately performing plural times an etching step and a step of making the resist masks recede or reducing them by ashing, the end portions of the first source electrode layer 168a and the first drain electrode layer 168b can have staircase-like shapes.

Note that the subsequent steps are performed in manners similar to those of the corresponding steps in the manufacturing process of the transistor 150 described in the above embodiment, whereby the transistor 152 described in this embodiment can be fabricated.

The above is the transistor of one embodiment of the present invention, whose structure can suppress an increase in oxygen vacancies in the oxide semiconductor layer. Specifically, in the transistor, oxygen can be supplied from the oxide insulating film and the gate insulating film which are in contact with the oxide semiconductor layer to the oxide semiconductor layer. It is thus possible to provide a semiconductor device having favorable electrical characteristics and high long-term reliability.

Note that this embodiment can be combined as appropriate with any of the other embodiments and examples in this specification.

Embodiment 4

In this embodiment, a transistor having a structure different from that of the transistor described in Embodiment 1 will be described with reference to FIGS. 7A to 7D and FIGS. 8A and 8B.

Figure 7A:
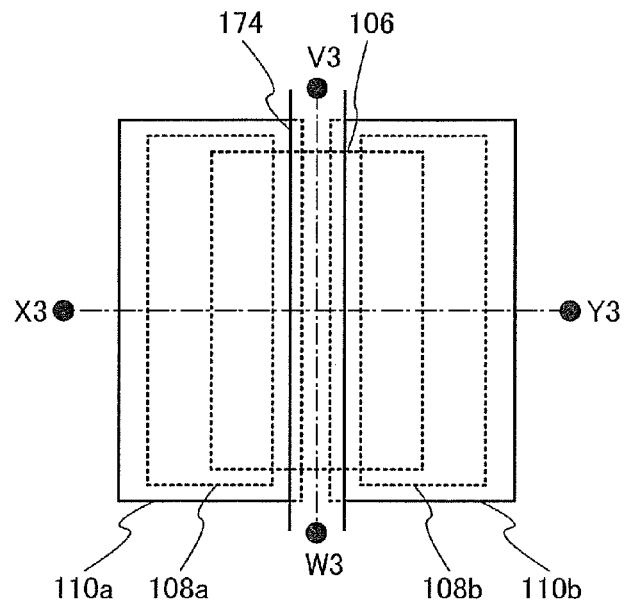
FIGS. 7A to 7D are a top view and cross-sectional views which illustrate a semiconductor device.
Figure 7C:
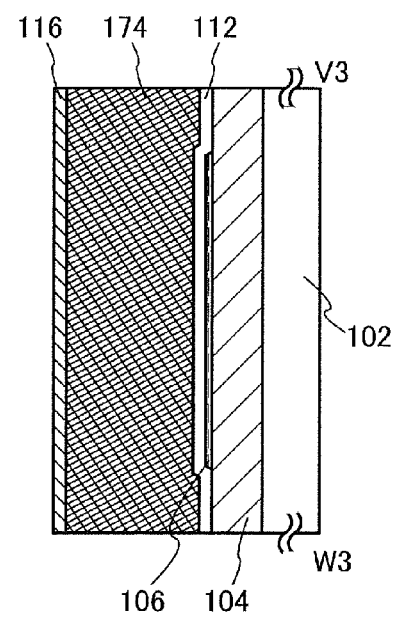
Figure 7B:
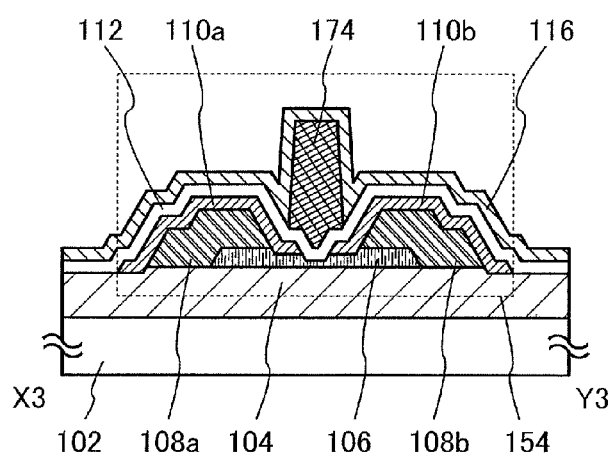
Figure 7D:
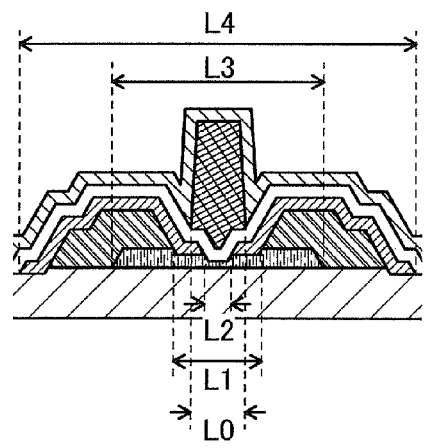

FIGS. 7A, 7B, 7C, and 7D are a top view and cross-sectional views which illustrate a transistor of one embodiment of the present invention. FIG. 7A is the top view of the transistor, and a cross section taken along a dashed-dotted line X3-Y3 in FIG. 7A is illustrated in FIG. 7B. A cross section taken along a dashed-dotted line V3-W3 in FIG. 7A is illustrated in FIG. 7C. FIG. 7D illustrates widths of components of the transistor which are illustrated in FIG. 7B. Note that for simplification of the drawing, some components in the top view in FIG. 7A are illustrated in a see-through manner or not illustrated. Note that the same portions as or portions having functions similar to those of the transistor described in Embodiment 1 are denoted by the same reference numerals, and repeated description thereof is omitted.

A transistor 154 illustrated in FIGS. 7A, 7B, 7C, and 7D includes the oxide insulating film 104 formed over the substrate 102; the oxide semiconductor layer 106 formed over the oxide insulating film 104; the first source electrode layer 108a and the first drain electrode layer 108b formed over the oxide semiconductor layer 106; the second source electrode layer 110a and the second drain electrode layer 110b formed over the first source electrode layer 108a and the first drain electrode layer 108b, respectively; the gate insulating film 112 formed over the oxide insulating film 104, the oxide semiconductor layer 106, the second source electrode layer 110a, and the second drain electrode layer 110b; a gate electrode layer 174 formed over the gate insulating film 112 and in a position overlapping with the oxide semiconductor layer 106; and the protective insulating film 116 formed over the gate insulating film 112 and the gate electrode layer 174. Note that another insulating layer, another wiring, or the like may be formed over the protective insulating film 116.

The transistor 154 described in this embodiment is different from the transistor 150 described in Embodiment 1 in the shape of the gate electrode layer 174. In the transistor 150, the gate electrode layer 114 is provided in a position overlapping with the first source electrode layer 108a, the first drain electrode layer 108b, the second source electrode layer 110a, and the second drain electrode layer 110b; however, in the transistor 154 described in this embodiment, the gate electrode layer 174 is provided in a position overlapping with the second source electrode layer 110a and the second drain electrode layer 110b. In other words, the gate electrode layer 174 is not provided in a position overlapping with the first source electrode layer 108a and the first drain electrode layer 108b.

Here, distances between the components are described with reference to the cross-sectional view in FIG. 7D.

The distance (L1) between the first source electrode layer 108a and the first drain electrode layer 108b is set to 0.8 μm or longer, preferably 1.0 μm or longer. In the case where L1 is shorter than 0.8 μm, influence of oxygen vacancies generated in the channel formation region cannot be eliminated, which might cause deterioration of the electrical characteristics of the transistor.

Even when the distance (L2) between the second source electrode layer 110a and the second drain electrode layer 110b is shorter than L1, for example, 30 nm or shorter, the transistor can have favorable electrical characteristics.

When the width of the gate electrode layer 174 is referred to as L0, L1≥L0≥L2 (L0 is longer than or equal to L2 and shorter than or equal to L1) is satisfied so that parasitic capacitance which is caused between the gate and the drain and between the gate and the source can be made small as much as possible. Accordingly, the frequency characteristics of the transistor can be improved. Note that in order to obtain favorable electrical characteristics of the transistor, it is preferable that a difference between L0 and L2 be greater than or equal to 2 nm and less than or equal to 20 nm and a difference between L1 and L2 be greater than or equal to 20 nm and less than or equal to 1 µm.

Note that in a transistor that does not require high frequency characteristics, L0≥L1≥L2 (L1 is longer than or equal to L2 and shorter than or equal to L0) may be satisfied as illustrated in FIG. 1B. With such a structure, the degree of difficulty in formation steps of the gate electrode can be lowered.

When the width of the oxide semiconductor layer 106 is referred to as L3 and the width of the transistor 154 is referred to as L4, L3 is preferably shorter than 1 µm and L4 is preferably longer than or equal to 1 µm and shorter than or equal to 2.5 µm. When L3 and L4 have the respective values, the transistor can be miniaturized.

Here, a manufacturing method of the transistor 154 will be described with reference to FIGS. 8A and 8B.

Figure 8A:
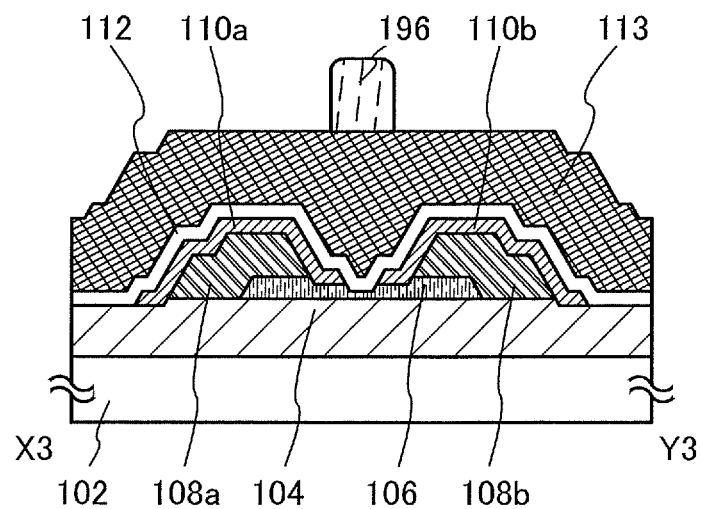
FIGS. 8A and 8B illustrate a method for manufacturing a semiconductor device.

In a manufacturing process of the transistor 154, steps before FIG. 8A are performed in a manner similar to those up to FIG. 3D in the manufacturing process of the transistor 150 (see FIG. 8A). Note that the cross section illustrated in FIG. 8A is different from the cross section illustrated in FIG. 3D in the shape of a resist mask 196.

Note that as the resist mask 196, a mask having a finer pattern which is formed by performing a slimming process on a mask formed by a photolithography method or the like is preferably used. As the slimming process, an ashing process in which oxygen in a radical state (an oxygen radical) is used can be employed, for example. As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, further preferably less than or equal to one third of the resolution limit of the light exposure apparatus. For example, the line width can be greater than or equal to 20 nm and less than or equal to 2000 nm, preferably greater than or equal to 50 nm and less than or equal to 350 nm.

Figure 8B:
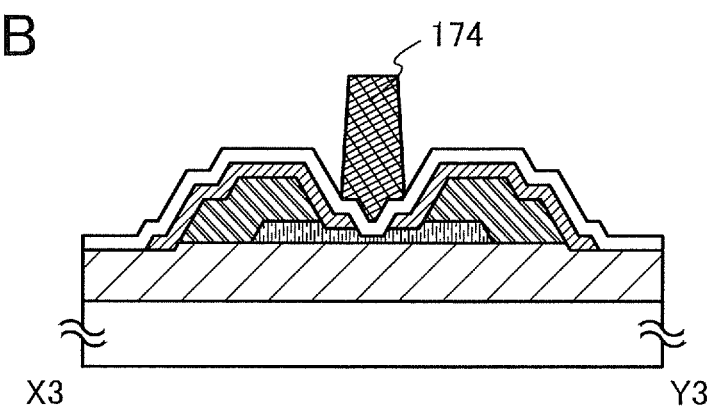

Then, the third conductive film 113 is etched with use of the resist mask 196, so that the gate electrode layer 174 is formed (see FIG. 8B).

Note that the subsequent steps are performed in manners similar to those of the corresponding steps in the manufacturing process of the transistor 150 described in the above embodiment, whereby the transistor 154 described in this embodiment can be manufactured.

The above is the transistor of one embodiment of the present invention, whose structure can suppress an increase in oxygen vacancies in the oxide semiconductor layer. Specifically, in the transistor, oxygen can be supplied from the oxide insulating film and the gate insulating film which are in contact with the oxide semiconductor layer to the oxide semiconductor layer. It is thus possible to provide a semiconductor device having favorable electrical characteristics and high long-term reliability.

Note that this embodiment can be combined as appropriate with any of the other embodiments and examples in this specification.

Embodiment 5

In this embodiment, a transistor having a structure different from that of the transistor described in Embodiment 1 will be described with reference to FIGS. 9A to 9C and FIGS. 10A to 10C.

Figure 9A:
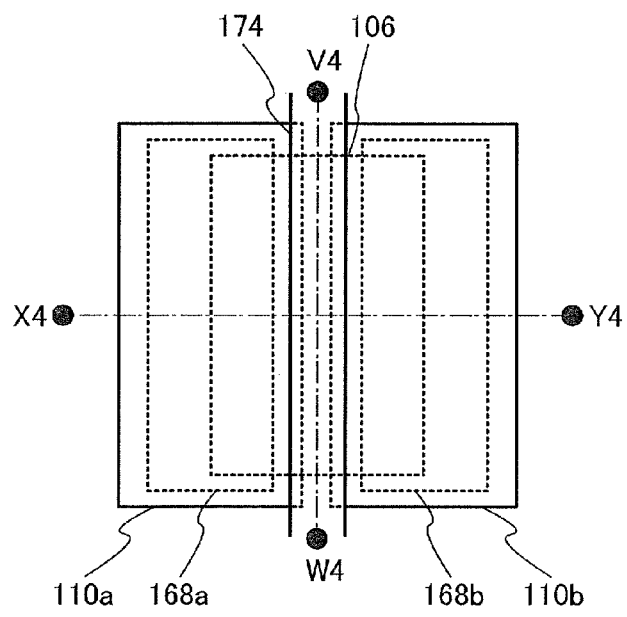
FIGS. 9A to 9C are a top view and cross-sectional views which illustrate a semiconductor device.
Figure 9C:
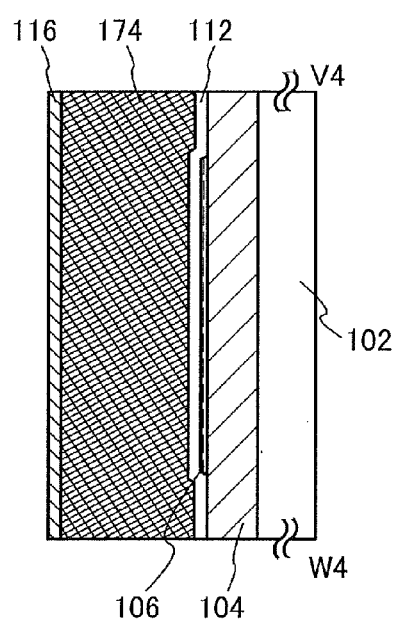
Figure 9B:
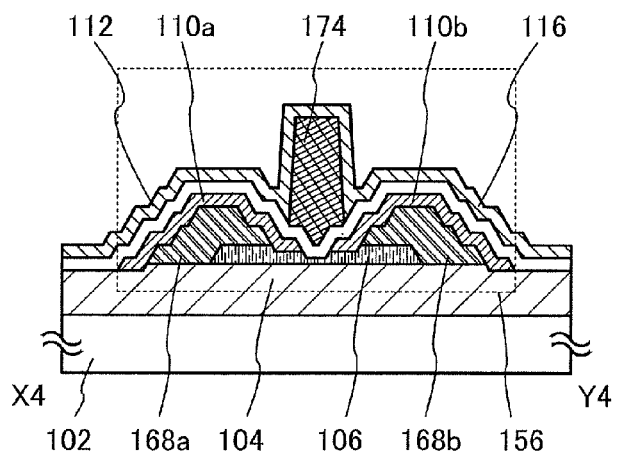

First, a transistor 156 illustrated in FIGS. 9A to 9C is described.

FIGS. 9A, 9B, and 9C are a top view and cross-sectional views which illustrate a transistor of one embodiment of the present invention. FIG. 9A is the top view of the transistor, and a cross section taken along a dashed-dotted line X4-Y4 in FIG. 9A is illustrated in FIG. 9B. A cross section taken along a dashed-dotted line V4-W4 in FIG. 9A is illustrated in FIG. 9C. Note that for simplification of the drawing, some components in the top view in FIG. 9A are illustrated in a see-through manner or not illustrated. Note that the same portions as or portions having functions similar to those of the transistor described in Embodiment 1 are denoted by the same reference numerals, and repeated description thereof is omitted.

The transistor 156 illustrated in FIGS. 9A, 9B, and 9C includes the oxide insulating film 104 formed over the substrate 102; the oxide semiconductor layer 106 formed over the oxide insulating film 104; the first source electrode layer 168a and the first drain electrode layer 168b formed over the oxide semiconductor layer 106; the second source electrode layer 110a and the second drain electrode layer 110b formed over the first source electrode layer 168a and the first drain electrode layer 168b, respectively; the gate insulating film 112 formed over the oxide insulating film 104, the oxide semiconductor layer 106, the second source electrode layer 110a, and the second drain electrode layer 110b; the gate electrode layer 174 formed over the gate insulating film 112 and in a position overlapping with the oxide semiconductor layer 106; and the protective insulating film 116 formed over the gate insulating film 112 and the gate electrode layer 174. Note that another insulating layer, another wiring, or the like may be formed over the protective insulating film 116.

The transistor 156 described in this embodiment is different from the transistor 150 described in Embodiment 1 in the shapes of the first source electrode layer 168a, the first drain electrode layer 168b, and the gate electrode layer 174. Note that the second source electrode layer 110a, the second drain electrode layer 110b, the gate insulating film 112, the gate electrode layer 174, and the protective insulating film 116 which are formed over the first source electrode layer 168a and the first drain electrode layer 168b have shapes corresponding to the shapes of the first source electrode layer 168a and the first drain electrode layer 168b.

In the transistor 150, the gate electrode layer 114 is provided in a position overlapping with the first source electrode layer 108a, the first drain electrode layer 108b, the second source electrode layer 110a, and the second drain electrode layer 110b; however, in the transistor 156 described in this embodiment, the gate electrode layer 174 is provided in a position overlapping with the second source electrode layer 110a and the second drain electrode layer 110b. In other words, the gate electrode layer 174 is not provided in a position overlapping with the first source electrode layer 168a and the first drain electrode layer 168b.

The transistor 156 described in this embodiment can be formed by referring to the manufacturing methods of the transistors 152 and 154 described in the above embodiments for the structures of the other components.

Figure 10A:
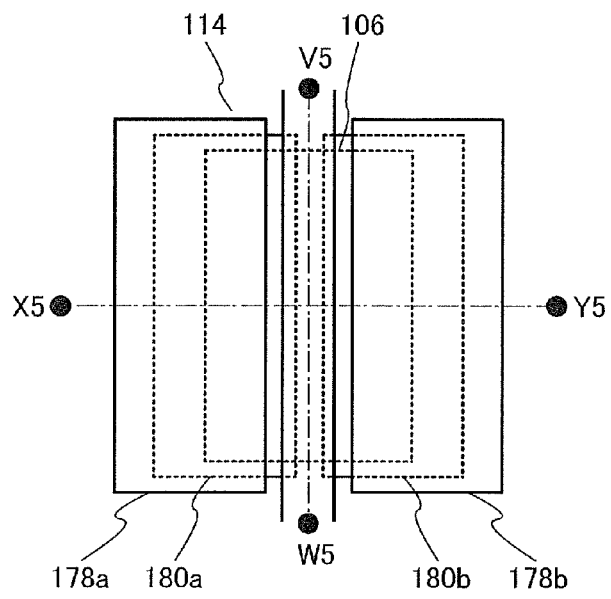
FIGS. 10A to 10C are a top view and cross-sectional views which illustrate a semiconductor device.
Figure 10C:
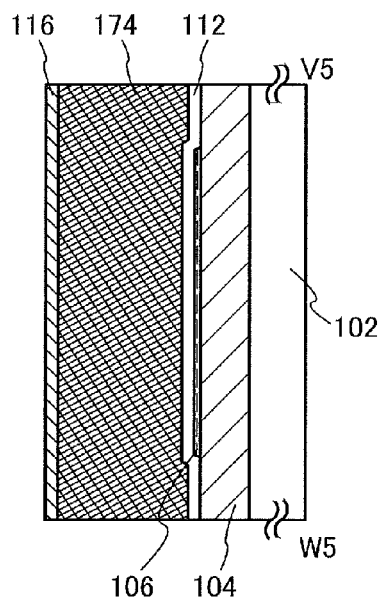
Figure 10B:
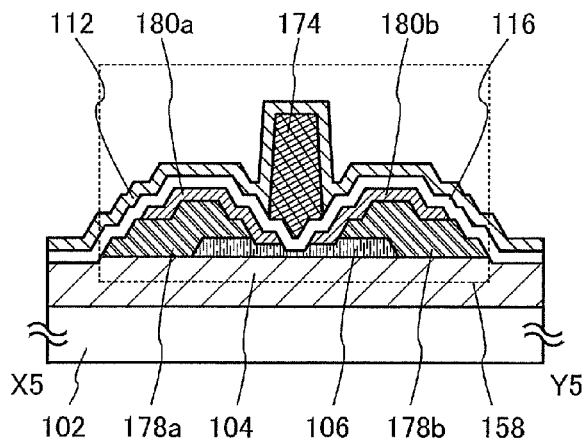

Next, a transistor 158 illustrated in FIGS. 10A to 10C is described.

The transistor 158 illustrated in FIGS. 10A, 10B, and 10C includes the oxide insulating film 104 formed over the substrate 102; the oxide semiconductor layer 106 formed over the oxide insulating film 104; a first source electrode layer 178a and a first drain electrode layer 178b formed over the oxide semiconductor layer 106; a second source electrode layer 180a and a second drain electrode layer 180b formed over the first source electrode layer 178a and the first drain electrode layer 178b, respectively; the gate insulating film 112 formed over the oxide insulating film 104, the oxide semiconductor layer 106, the second source electrode layer 180a, and the second drain electrode layer 180b; the gate electrode layer 174 formed over the gate insulating film 112 and in a position overlapping with the oxide semiconductor layer 106; and the protective insulating film 116 formed over the gate insulating film 112 and the gate electrode layer 174. Note that another insulating layer, another wiring, or the like may be formed over the protective insulating film 116.

The transistor 158 described in this embodiment is different from the transistor 150 described in Embodiment 1 in the shapes of the first source electrode layer 178a, the first drain electrode layer 178b, the second source electrode layer 180a, the second drain electrode layer 180b, and the gate electrode layer 174. Note that the second source electrode layer 180a, the second drain electrode layer 180b, the gate insulating film 112, the gate electrode layer 174, and the protective insulating film 116 which are formed over the first source electrode layer 178a and the first drain electrode layer 178b have shapes corresponding to the shapes of the first source electrode layer 178a and the first drain electrode layer 178b.

With the shapes of the first source electrode layer 178a and the first drain electrode layer 178b as illustrated in FIG. 10B, the second source electrode layer 180a, the second drain electrode layer 180b, and the gate insulating film 112 can have favorable coverage.

Further, the second source electrode layer 180a and the second drain electrode layer 180b are provided on inner sides than the edges of the first source electrode layer 178a and the first drain electrode layer 178b in the cross section in the channel length direction (FIG. 10B). The first source electrode layer 178a and the first drain electrode layer 178b are not necessarily covered with the second source electrode layer 180a and the second drain electrode layer 180b as long as the second source electrode layer 180a and the second drain electrode layer 180b are provided in this manner at least over part of a region of the oxide semiconductor layer 106 serving as a channel. Note that when the first source electrode layer and the first drain electrode layer are covered with the second source electrode layer and the second drain electrode layer as in any of the transistors described in the above embodiments, a possibility that oxygen might be diffused or transferred to the side faces of the first source electrode layer and the first drain electrode layer is reduced; accordingly, with such a structure, oxygen can be favorably supplied to the oxide semiconductor layer from the oxide insulating film through the gate insulating film.

The above is the transistor of one embodiment of the present invention, whose structure can suppress an increase in oxygen vacancies in the oxide semiconductor layer. Specifically, in the transistor, oxygen can be supplied from the oxide insulating film and the gate insulating film which are in contact with the oxide semiconductor layer to the oxide semiconductor layer. It is thus possible to provide a semiconductor device having favorable electrical characteristics and high long-term reliability.

Note that this embodiment can be combined as appropriate with any of the other embodiments and examples in this specification.

Embodiment 6

In this embodiment, an example of a semiconductor device (memory device) which includes a transistor of one embodiment of the present invention, which can retain stored data even when not powered, and which has an unlimited number of write cycles will be described with reference to drawings.

Figure 11A:
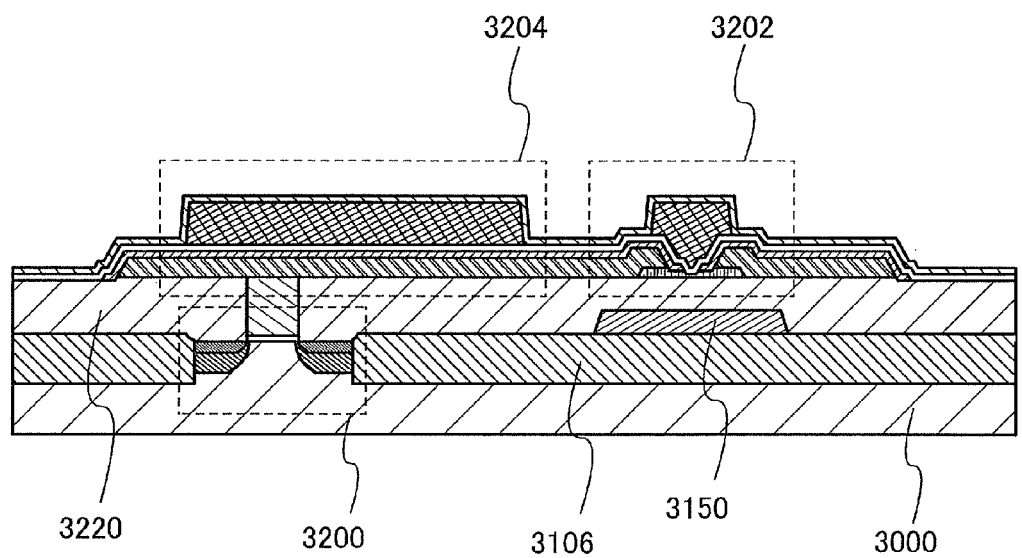
FIG. 11A is a cross-sectional view of a semiconductor device.
Figure 11B:
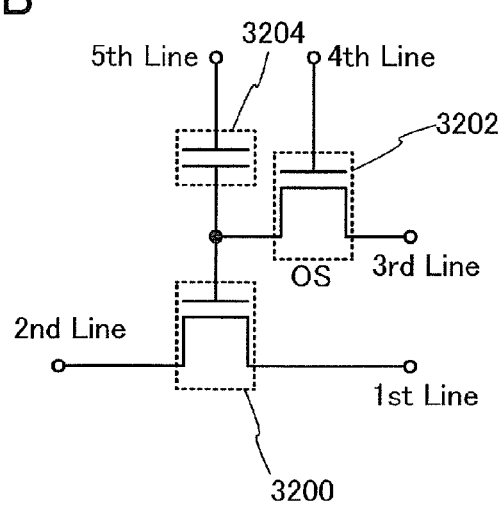
FIG. 11B is a circuit diagram thereof.

FIG. 11A is a cross-sectional view of the semiconductor device, and FIG. 11B is a circuit diagram of the semiconductor device.

The semiconductor device illustrated in FIGS. 11A and 11B includes a transistor 3200 including a first semiconductor material in a lower portion, and a transistor 3202 including a second semiconductor material and a capacitor 3204 in an upper portion. As the transistor 3202, any of the transistors described in Embodiments 1 to 5 can be used, and an example in which the transistor 150 described in Embodiment 1 with reference to FIGS. 1A to 1E is applied to the transistor 3202 is described in this embodiment. One electrode of the capacitor 3204 is formed using the same material as a gate electrode of the transistor 3202, the other electrode thereof is formed using the same material as a source electrode and a drain electrode of the transistor 3202, and a dielectric thereof is formed using the same material as the a gate insulating film 112 of the transistor 3202; thus, the capacitor 3204 can be formed concurrently with the transistor 3202.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including, for example, crystalline silicon as a material other than an oxide semiconductor can operate at high speed easily. On the other hand, a transistor including an oxide semiconductor enables charge to be stored for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor for holding data.

The transistor 3200 in FIG. 11A includes a channel formation region provided in a substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3106 is formed on the substrate 3000 so as to surround the transistor 3200, and an oxide insulating film 3220 is formed so as to cover the transistor 3200. The element isolation insulating layer 3106 can be formed by an element isolation technique such as local oxidation of silicon (LOCOS) or shallow trench isolation (STI).

For example, the transistor 3200 formed using a crystalline silicon substrate can operate at high speed. Thus, when the transistor is used as a reading transistor, data can be read at a high speed. As treatment prior to formation of the transistor 3202 and the capacitor 3204, CMP treatment is performed on the oxide insulating film 3220 covering the transistor 3200, whereby the oxide insulating film 3220 is planarized and, at the same time, an upper surface of the gate electrode layer of the transistor 3200 is exposed.

The transistor 3202 is provided over the oxide insulating film 3220, and one of the source electrode and the drain electrode thereof is extended so as to function as the other electrode of the capacitor 3204.

The transistor 3202 in FIG. 11A is a top-gate transistor in which a channel is formed in an oxide semiconductor layer. Since the off-state current of the transistor 3202 is low, stored data can be retained for a long time owing to such a transistor. In other words, refresh operation becomes unnecessary or the frequency of the refresh operation in a semiconductor memory device can be extremely low, which leads to a sufficient reduction in power consumption.

Further, an electrode 3150 overlaps with the transistor 3202 with the oxide insulating film 3220 provided therebetween. By supplying an appropriate potential to the electrode 3150, the threshold voltage of the transistor 3202 can be controlled. In addition, long-term reliability of the transistor 3202 can be improved.

The transistor 3200 and the transistor 3202 can be formed so as to overlap with each other as illustrated in FIG. 11A, whereby the area occupied by them can be reduced. Accordingly, the degree of integration of the semiconductor device can be increased.

An example of a circuit configuration corresponding to FIG. 11A is illustrated in FIG. 11B.

In FIG. 11B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to one of the source and drain electrode layers of the transistor 3202, and a fourth wiring (4th Line) is electrically connected to the gate electrode layer of the transistor 3202. The gate electrode layer of the transistor 3200 and the other of the source and drain electrode layers of the transistor 3202 are electrically connected to the one electrode of the capacitor 3204. A fifth wiring (5th Line) is electrically connected to the other electrode of the capacitor 3204.

The semiconductor device in FIG. 11B utilizes a characteristic in which the potential of the gate electrode layer of the transistor 3200 can be held, and thus enables writing, storing, and reading of data as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is extremely low, the charge of the gate electrode layer of the transistor 3200 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data stored in the gate electrode layer can be read by determining the potential of the second wiring.

Note that in the case where memory cells are arrayed, it is necessary that only data of a desired memory cell be able to be read. The fifth wiring in the case where data is not read may be supplied with a potential at which the transistor 3200 is turned off regardless of the state of the gate electrode layer, that is, a potential lower than $V_{th\_H}$. Alternatively, the fifth wiring may be supplied with a potential at which the transistor 3200 is turned on regardless of the state of the gate electrode layer, that is, a potential higher than $V_{th\_L}$.

When a transistor having a channel formation region formed using an oxide semiconductor and having extremely low off-state current is applied to the semiconductor device in this embodiment, the semiconductor device can store data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a manufacturing method of the semiconductor device can be provided.

Note that this embodiment can be combined as appropriate with any of the other embodiments and examples in this specification.

Embodiment 7

In this embodiment, a semiconductor device including a transistor of one embodiment of the present invention, which can retain stored data even when not powered, which does not have a limitation on the number of write cycles, and which has a structure different from that described in Embodiment 6 will be described.

Figure 12A:
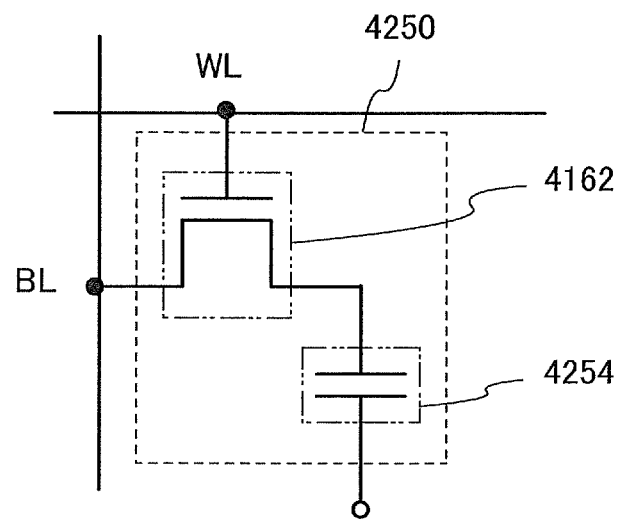
FIG. 12A is a circuit diagram of a semiconductor device.
Figure 12B:
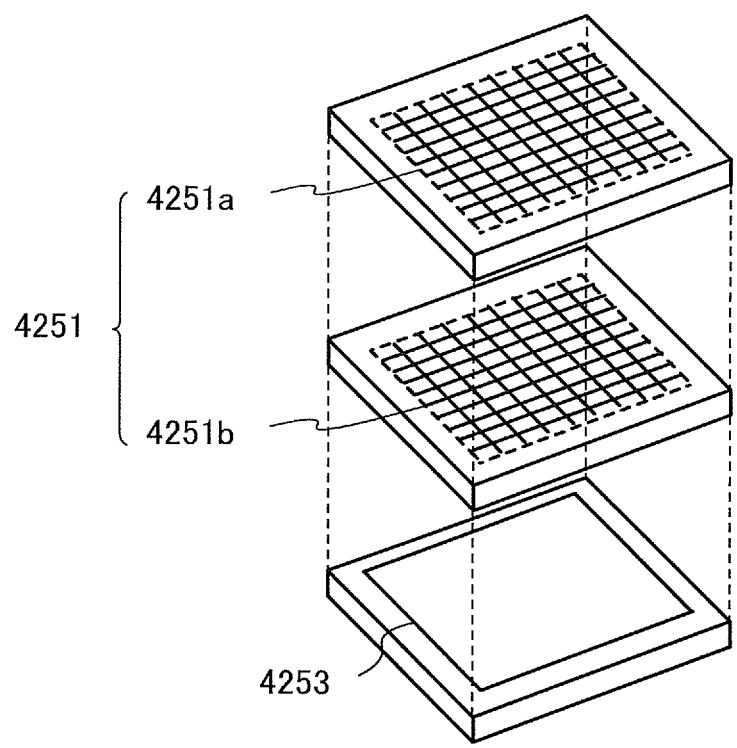
FIG. 12B is a perspective view thereof.

FIG. 12A illustrates an example of a circuit configuration of the semiconductor device, and FIG. 12B is a conceptual diagram illustrating an example of the semiconductor device. As a transistor 4162 included in the semiconductor device, any of the transistors described in Embodiments 1 to 5 can be used. A capacitor 4254 can be formed through the same process and at the same time as the transistor 4162 in a manner similar to that of the capacitor 3204 described in Embodiment 6.

In the semiconductor device illustrated in FIG. 12A, a bit line BL is electrically connected to a source electrode of the transistor 4162, a word line WL is electrically connected to a gate electrode of the transistor 4162, and a drain electrode of the transistor 4162 is electrically connected to a first terminal of the capacitor 4254.

Next, writing and storing of data in the semiconductor device (a memory cell 4250) illustrated in FIG. 12A are described.

First, the potential of the word line WL is set to a potential at which the transistor 4162 is turned on, and the transistor 4162 is turned on. Accordingly, the potential of the bit line BL is supplied to the first terminal of the capacitor 4254 (writing). After that, the potential of the word line WL is set to a potential at which the transistor 4162 is turned off, so that the transistor 4162 is turned off. Thus, the potential at the first terminal of the capacitor 4254 is held (holding).

In addition, the transistor 4162 including an oxide semiconductor has an extremely low off-state current. For that reason, the potential of the first terminal of the capacitor 4254 (or a charge accumulated in the capacitor 4254) can be held for an extremely long time by turning off the transistor 4162.

Next, reading of data is described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0} + C \times V)/(C_B + C)$, where V is the potential of the first terminal of the capacitor 4254, C is the capacitance of the capacitor 4254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparing the potential of the bit line BL with a predetermined potential, data can be read.

As described above, the semiconductor device illustrated in FIG. 12A can hold charge that is accumulated in the capacitor 4254 for a long time because the off-state current of the transistor 4162 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 12B is described.

The semiconductor device illustrated in FIG. 12B includes a memory cell array 4251 (memory cell arrays 4251a and 4251b) including the plurality of memory cells 4250 illustrated in FIG. 12A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 12B, the peripheral circuit 4253 can be provided under the memory cell array 4251. Thus, the size of the semiconductor device can be reduced.

It is preferable that a semiconductor material of the transistor provided in the peripheral circuit 4253 be different from that of the transistor 4162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 12B illustrates, as an example, the semiconductor device in which the memory cell array 4251 has a stack of the memory cell array 4251a and the memory cell array 4251b; however, the number of stacked memory cell arrays is not limited to two. For the memory cell array 4251, a stack of three or more memory cell arrays may be used, or only one memory cell array may be used.

The transistor 4162 is formed using an oxide semiconductor, and any of the transistors described in Embodiments 1 to 5 can be used as the transistor 4162. Since the off-state current of the transistor including an oxide semiconductor is low, stored data can be retained for a long time. In other words, the frequency of refresh operation can be extremely low, which leads to a sufficient reduction in power consumption.

A semiconductor device having a novel feature can be obtained by being provided with both a peripheral circuit which includes the transistor including a material other than an oxide semiconductor (in other words, a transistor capable of operating at sufficiently high speed) and a memory circuit which includes the transistor including an oxide semiconductor (in a broader sense, a transistor whose off-state current is sufficiently low). In addition, with a structure where the peripheral circuit and the memory circuit are stacked, an increase in the degree of integration of the semiconductor device can be achieved.

As described above, a miniaturized and highly-integrated semiconductor device having high electrical characteristics can be provided.

Note that this embodiment can be combined as appropriate with any of the other embodiments and examples in this specification.

Embodiment 8

In this embodiment, examples of an electronic device and an electric device which can use any of the transistors described in Embodiments 1 to 5 will be described.

Any of the transistors described in Embodiments 1 to 5 can be applied to a variety of electronic devices (including game machines) and electric devices. Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, and IC chips. Examples of the electric devices include high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples include alarm devices such as smoke detectors, gas alarm devices, and security alarm devices. Further, the examples include industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices and electric devices are illustrated in FIG. 13, FIG. 14, FIGS. 15A to 15C, and FIGS. 16A to 16C.

First, as an example of the alarm device, a structure of a fire alarm is described with reference to FIG. 13. A fire alarm in this specification refers to any device which raises an alarm over fire occurrence instantly, and for example, a residential fire alarm, an automatic fire alarm system, and a fire detector used for the automatic fire alarm system are included in its category.

Figure 13:
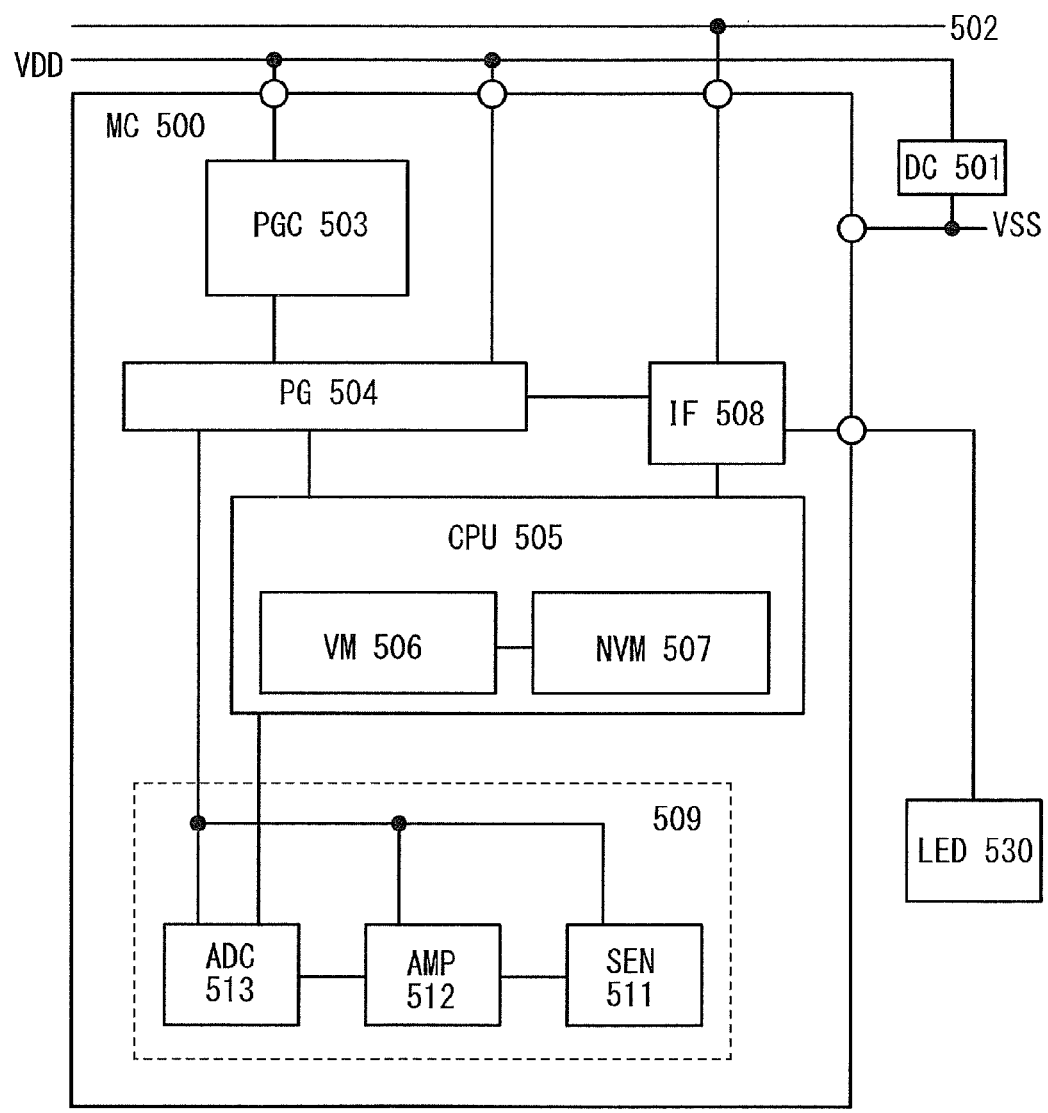
FIG. 13 is a block diagram of a semiconductor device.

An alarm device illustrated in FIG. 13 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I$^2$C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with the case where power is continuously supplied to the above structures.

In the case where a transistor is used as the power gate 504, it is preferable to use a transistor which has an extremely low off-state current and is used for the nonvolatile memory portion 507, for example, a transistor including an oxide semiconductor. With use of such a transistor, leakage current can be reduced when supply of power is stopped by the power gate 504, so that a reduction in power consumption of the alarm device can be achieved.

A direct-current power source 501 may be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

Figure 14:
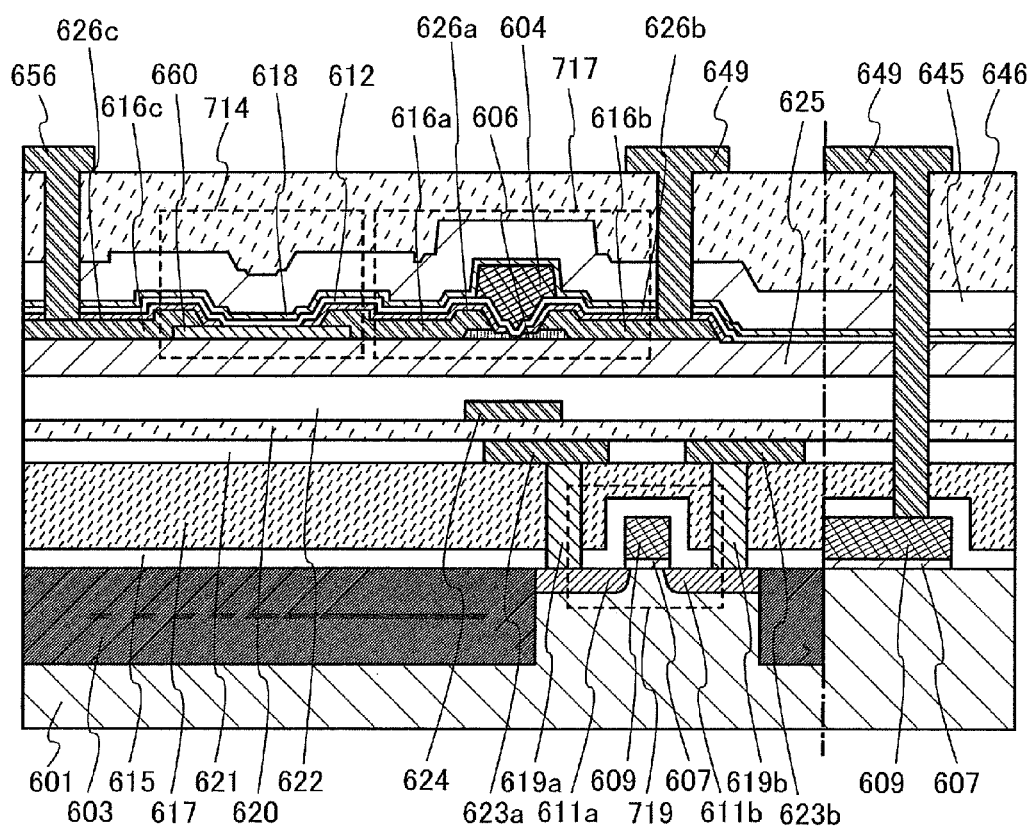
FIG. 14 is a cross-sectional view of a semiconductor device.

Here, FIG. 14 illustrates part of the cross section of the alarm device illustrated in FIG. 13. In the alarm device, element isolation regions 603 are formed in a p-type semiconductor substrate 601, and an n-channel transistor 719 including a gate insulating film 607, a gate electrode layer 609, n-type impurity regions 611a and 611b, an insulating film 615, and an insulating film 617 is formed. The n-channel transistor 719 is formed using a semiconductor other than an oxide semiconductor, such as single crystal silicon, so that the n-channel transistor 719 can operate at sufficiently high speed. Accordingly, a volatile memory portion of a CPU that can achieve high-speed access can be formed.

In addition, contact plugs 619a and 619b are formed in openings which are formed by partly etching the insulating films 615 and 617, and an insulating film 621 having groove portions is formed over the insulating film 617 and the contact plugs 619a and 619b.

Wirings 623a and 623b are formed in the groove portions of the insulating film 621, and an insulating film 620 formed by a sputtering method, a CVD method, or the like is provided over the insulating film 621 and the wirings 623a and 623b. An insulating film 622 having a groove portion is formed over the insulating film 620.

An electrode 624 functioning as a back gate electrode of a second transistor 717 is formed in the groove portion of the insulating film 622. The electrode 624 can control the threshold voltage of the second transistor 717.

An oxide insulating film 625 formed by a sputtering method, a CVD method, or the like is provided over the insulating film 622 and the electrode 624, and the second transistor 717 and a photoelectric conversion element 714 are provided over the oxide insulating film 625.

The second transistor 717 includes an oxide semiconductor layer 606, a first source electrode layer 616a and a first drain electrode layer 616b in contact with the oxide semiconductor layer 606, a second source electrode layer 626a and a second drain electrode layer 626b in contact with upper portions of the first source electrode layer 616a and the first drain electrode layer 616b, a gate insulating film 612, a gate electrode layer 604, and a protective insulating film 618. Moreover, an insulating film 645 and an insulating film 646 cover the photoelectric conversion element 714 and the second transistor 717, and a wiring 649 is formed over the insulating film 646 so as to be in contact with the first drain electrode layer 616b. The wiring 649 functions as the node which electrically connects a drain electrode of the second transistor 717 to the gate electrode layer 609 of the n-channel transistor 719.

Although the structure in which the connection portion of the second transistor 717 and the wiring 649 is in contact with the first drain electrode layer 616b is shown as an example in this embodiment, without limitation thereon, a structure in which the connection portion is in contact with the second drain electrode layer 626b may be employed, for example.

Here, any of the transistors described in Embodiments 1 to 5 can be used as the second transistor 717, and the oxide semiconductor layer 606 corresponds to the oxide semiconductor layer 106 described in Embodiment 1. Moreover, the first source electrode layer 616a and the first drain electrode layer 616b correspond to the first source electrode layer 108a and the first drain electrode layer 108b described in Embodiment 1, respectively. The second source electrode layer 626a and the second drain electrode layer 626b correspond to the second source electrode layer 110a and the second drain electrode layer 110b described in Embodiment 1, respectively.

The optical sensor 511 includes the photoelectric conversion element 714, a capacitor, a first transistor, the second transistor 717, a third transistor, and the n-channel transistor 719. As the photoelectric conversion element 714, a photodiode can be used here, for example.

One of terminals of the photoelectric conversion element 714 is electrically connected to the low potential power supply line VSS, and the other of the terminals thereof is electrically connected to one of the first source electrode layer 616a and the first drain electrode layer 616b and/or one of the second source electrode layer 626a and the second drain electrode layer 626b of the second transistor 717.

The gate electrode layer 604 of the second transistor 717 is supplied with an electric charge accumulation control signal Tx, and the other of the first source electrode layer 616a and the first drain electrode layer 616b and/or the other of the second source electrode layer 626a and the second drain electrode layer 626b of the second transistor 717 are/is electrically connected to one of a pair of electrodes of the capacitor, one of a source electrode and a drain electrode of the first transistor, and the gate electrode of the n-channel transistor 719 (hereinafter the node is referred to as a node FD in some cases).

The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD.

One of a source electrode and a drain electrode of the n-channel transistor 719 is electrically connected to one of a source electrode and a drain electrode of the third transistor and the amplifier 512. The other of the source electrode and the drain electrode of the n-channel transistor 719 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 719 or the like is sufficiently large, a structure without the capacitor may be employed.

Further, as each of the first transistor and the second transistor 717, the transistor having an extremely low off-state current is preferably used. As the transistor having an extremely low off-state current, a transistor including an oxide semiconductor is preferably used. With such a structure, the potential of the node FD can be held for a long time.

In the structure in FIG. 14, the photoelectric conversion element 714 is electrically connected to the second transistor 717 and is provided over the oxide insulating film 625.

The photoelectric conversion element 714 includes a semiconductor film 660 provided over the oxide insulating film 625, and the first source electrode layer 616a and an electrode 616c which are in contact with a top surface of the semiconductor film 660. The first source electrode layer 616a is an electrode functioning as the source electrode or the drain electrode of the second transistor 717 and electrically connects the photoelectric conversion element 714 to the second transistor 717. In the photoelectric conversion element 714, the second source electrode layer 626a and an electrode 626c are provided over the first source electrode layer 616a and the electrode 616c, respectively.

Over the semiconductor film 660, the second source electrode layer 626a, and the electrode 626c, the gate insulating film 612, the protective insulating film 618, the insulating film 645, and the insulating film 646 are provided. Further, a wiring 656 is formed over the insulating film 646 and is in contact with the electrode 616c through an opening provided in the electrode 626c, the gate insulating film 612, the protective insulating film 618, the insulating film 645, and the insulating film 646.

The electrode 616c can be formed in steps similar to those of the first source electrode layer 616a and the first drain electrode layer 616b, and the wiring 656 can be formed in steps similar to those of the wiring 649.

As the semiconductor film 660, a semiconductor film which can perform photoelectric conversion is provided, and for example, silicon or germanium can be used. In the case of using silicon, the semiconductor film 660 functions as an optical sensor which senses visible light. Further, there is a difference, between silicon and germanium, in wavelengths of electromagnetic waves that can be absorbed. When the semiconductor film 660 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 500.

In the alarm device including the above-described IC chip, the CPU 505 in which a plurality of circuits including any of the transistors described in the above embodiments are combined and mounted on one IC chip is used.

Figure 15A:
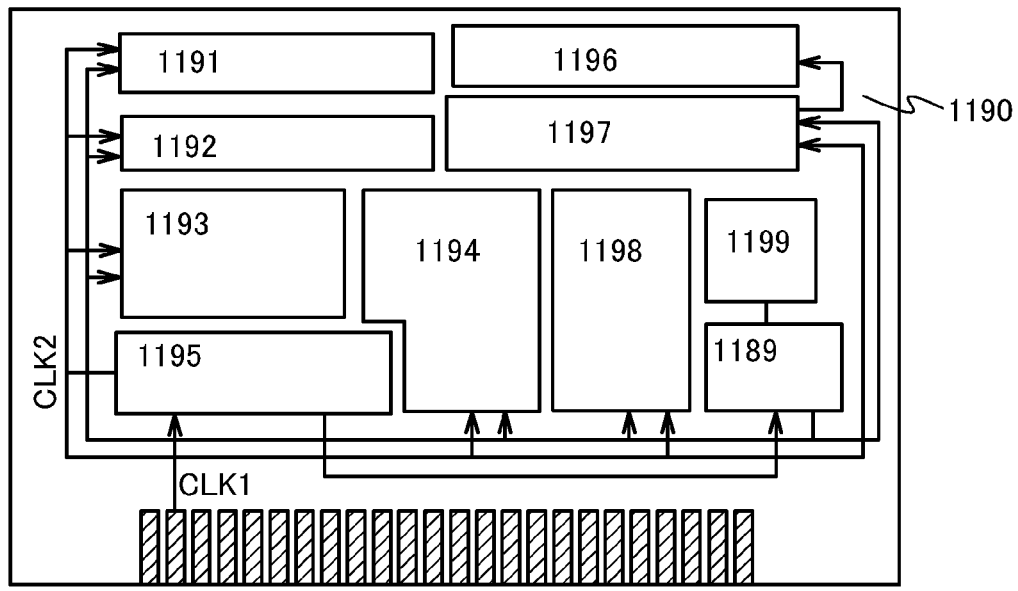
FIGS. 15A to 15C are block diagrams of a semiconductor device.
Figure 15B:
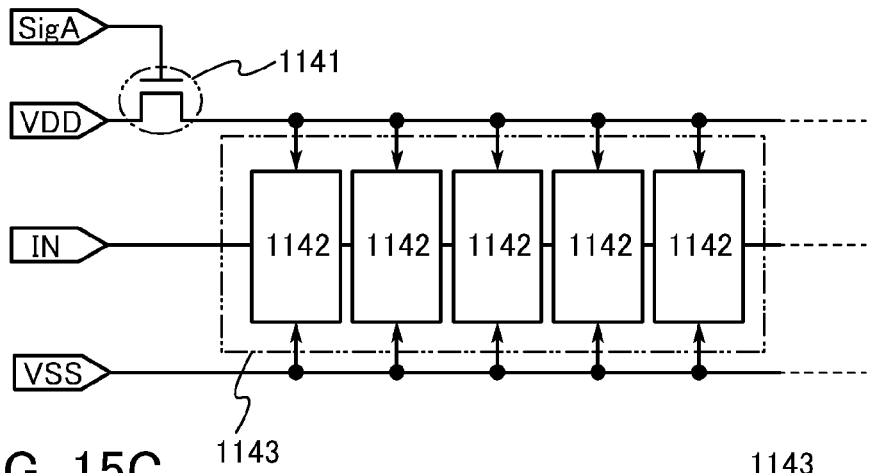
Figure 15C:
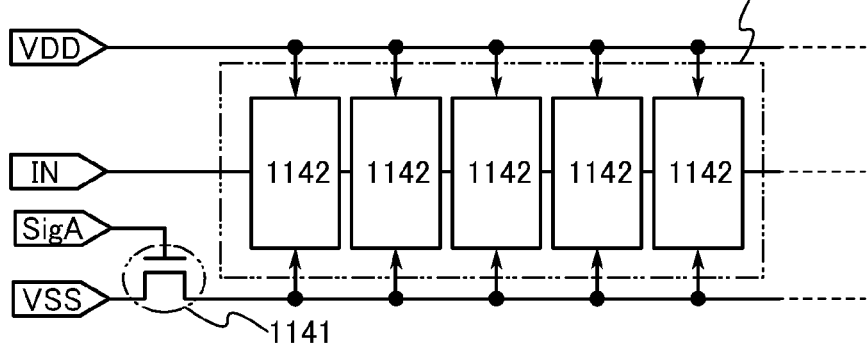

FIGS. 15A to 15C are block diagrams illustrating a specific configuration of a CPU at least partly including any of the transistors described in Embodiments 1 to 5.

The CPU illustrated in FIG. 15A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 15A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 15A, a memory cell is provided in the register 1196. As the memory cell of the register 1196, any of the transistors described in the above embodiments can be used.

In the CPU illustrated in FIG. 15A, the register controller 1197 selects operation of storing data in the register 1196 in accordance with an instruction from the ALU 1191. That is, the register controller 1197 selects whether data is stored by a flip-flop or by a capacitor in the memory cell included in the register 1196. When data storing by the flip-flop is selected, a power supply voltage is supplied to the memory cell in the register 1196. When data storing by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 15B or FIG. 15C. Circuits illustrated in FIGS. 15B and 15C are described below.

FIGS. 15B and 15C each illustrate an example of the configuration of a memory circuit in which any of the transistors described in the above embodiments is used as a switching element which controls supply of a power supply potential to a memory cell.

The memory device illustrated in FIG. 15B includes a switching element 1141 and a memory cell group 1143 including a plurality of memory cells 1142. Specifically, as each of the memory cells 1142, any of the transistors described in the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 15B, any of the transistors described in the above embodiments is used as the switching element 1141, and the switching of the transistor is controlled by a signal SigA supplied to a gate electrode layer thereof.

Note that FIG. 15B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 15B, the switching element 1141 may control the supply of the low-level power supply potential VSS.

In FIG. 15C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be stored even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 16A:
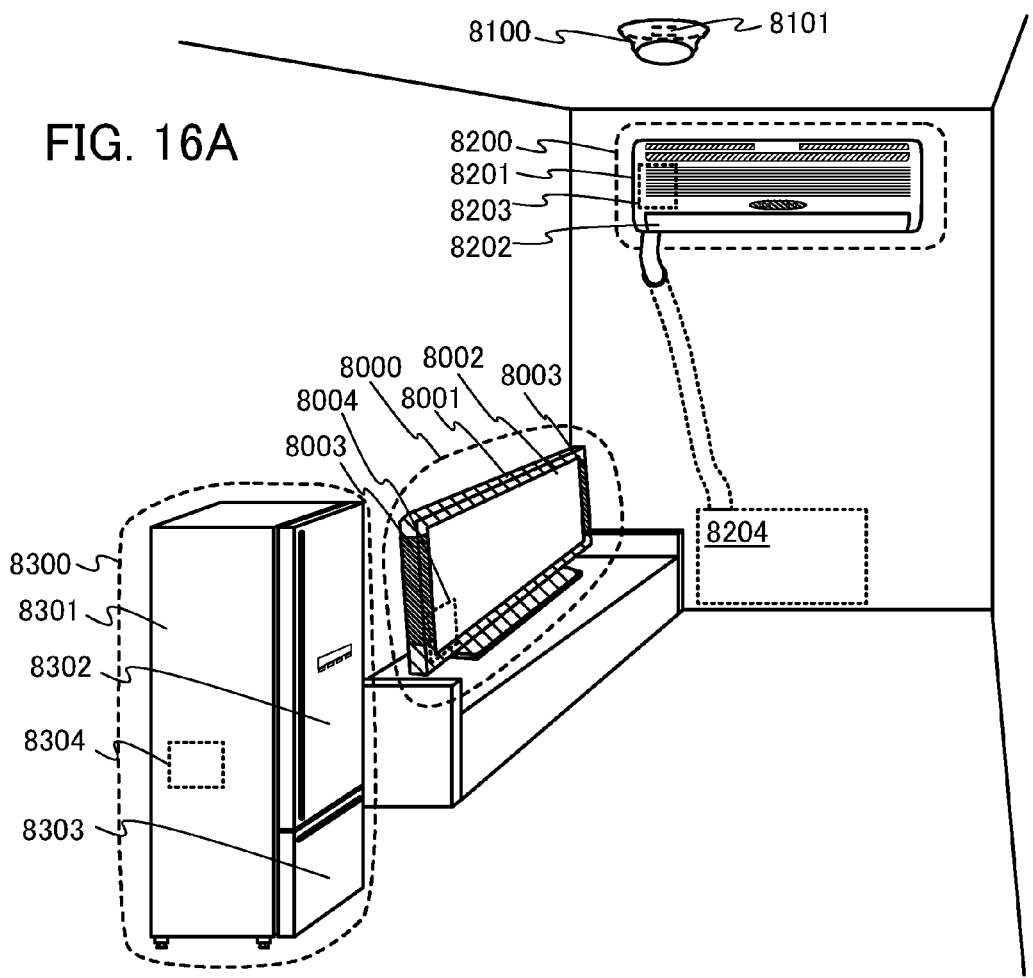
FIGS. 16A to 16C illustrate electronic devices to which a semiconductor device can be applied.

In FIG. 16A, an alarm device 8100 is a residential fire alarm, which is an example of an electric device including a sensor portion and a microcomputer 8101. Note that the microcomputer 8101 is an example of an electronic device including a CPU in which any of the transistors described in the above embodiments is used.

In FIG. 16A, an air conditioner which includes an indoor unit 8200 and an outdoor unit 8204 is an example of an electric device including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 16A, the CPU 8203 may be provided in the outdoor unit 8204. Alternatively, the CPU 8203 may be provided in both the indoor unit 8200 and the outdoor unit 8204. By using any of the transistors described in the above embodiments as the CPU in the air conditioner, a reduction in power consumption of the air conditioner can be achieved.

In FIG. 16A, an electric refrigerator-freezer 8300 is an example of an electric device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 16A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

Figure 16B:
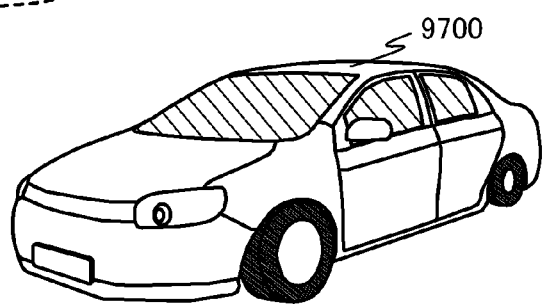
Figure 16C:
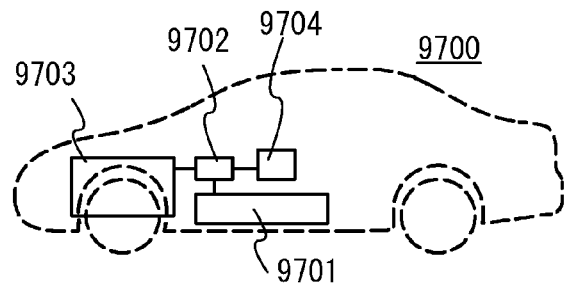

FIGS. 16B and 16C illustrate an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Note that this embodiment can be combined as appropriate with any of the other embodiments and examples in this specification.

Example 1

In this example, a conductive film was formed over an oxide semiconductor film and diffusion or transfer of elements which exist between the stacked films was examined by secondary ion mass spectrometry (SIMS), and results thereof will be described.

Figure 17A:
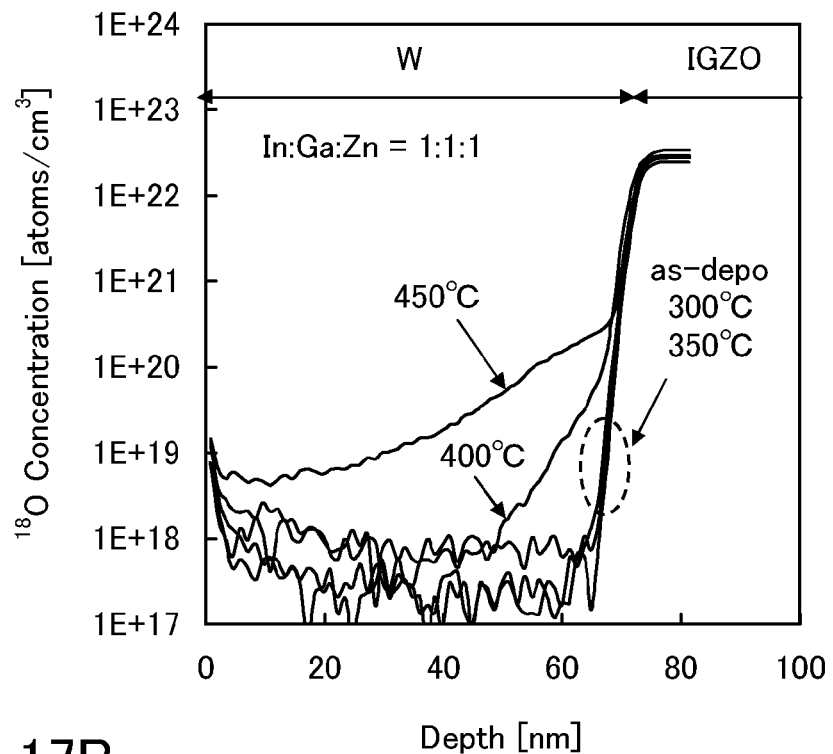
FIGS. 17A and 17B show results of SIMS analysis of a stacked layer including an IGZO film and a tungsten film.
Figure 17B:
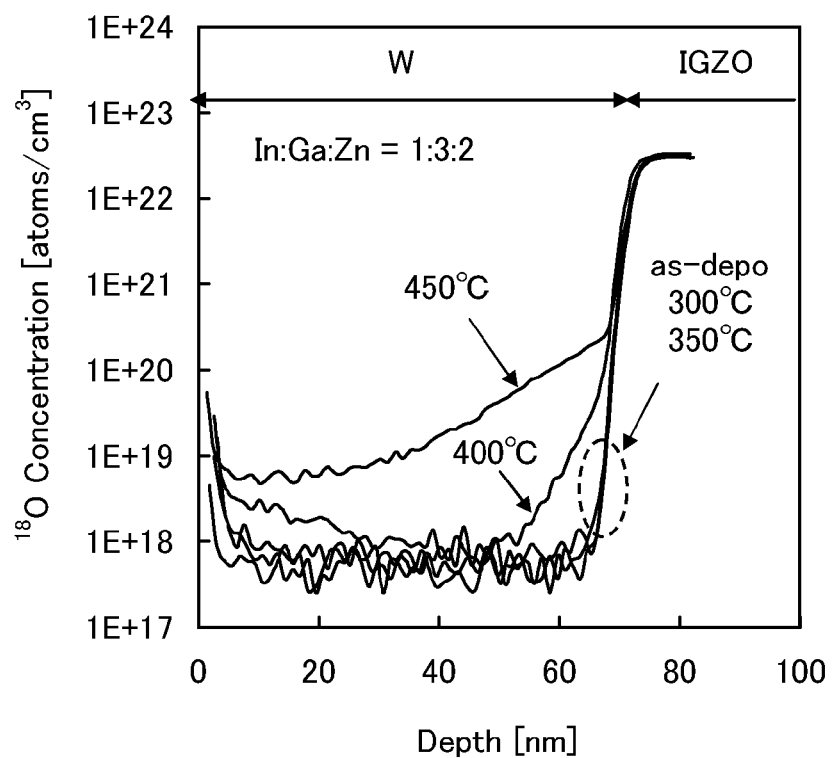

FIGS. 17A and 17B each show SIMS analysis results of profiles of an oxygen isotope ($^{18}O$) in a depth direction before and after heat treatment in samples which were each fabricated with a stack of an IGZO film and a tungsten film by a sputtering method. Note that the IGZO film was formed by a DC sputtering method with a sputtering target containing In, Ga, and Zn at an atomic ratio of 1:1:1 or 1:3:2 and a deposition gas containing Ar and $O_2$ ($^{18}O$) at a flow rate ratio of 2:1. The tungsten film was formed by a DC sputtering method with a tungsten sputtering target and a 100 percent Ar gas used as a deposition gas. Note that heat treatment was performed at 300° C., 350° C., 400° C., and 450° C. each for one hour, and five samples including a sample which was not subjected to heat treatment were compared with one another.

Here, the IGZO film formed with the sputtering target containing In, Ga, and Zn at an atomic ratio of 1:1:1 is a crystalline IGZO film, and the IGZO film formed with the sputtering target containing In, Ga, and Zn at an atomic ratio of 1:3:2 is an amorphous IGZO film.

As shown in FIGS. 17A and 17B, as the temperature of the heat treatment is increased, oxygen of the oxide semiconductor film is taken into the tungsten film despite the composition or crystallinity of the oxide semiconductor film.

Since the fabrication process of the transistor involves some heat treatment steps, oxygen vacancies are generated in a region of the oxide semiconductor layer, which is in contact with the source electrode or the drain electrode, and the region becomes an n-type. Thus, the n-type region can serve as a source or a drain of the transistor.

Figure 18A:
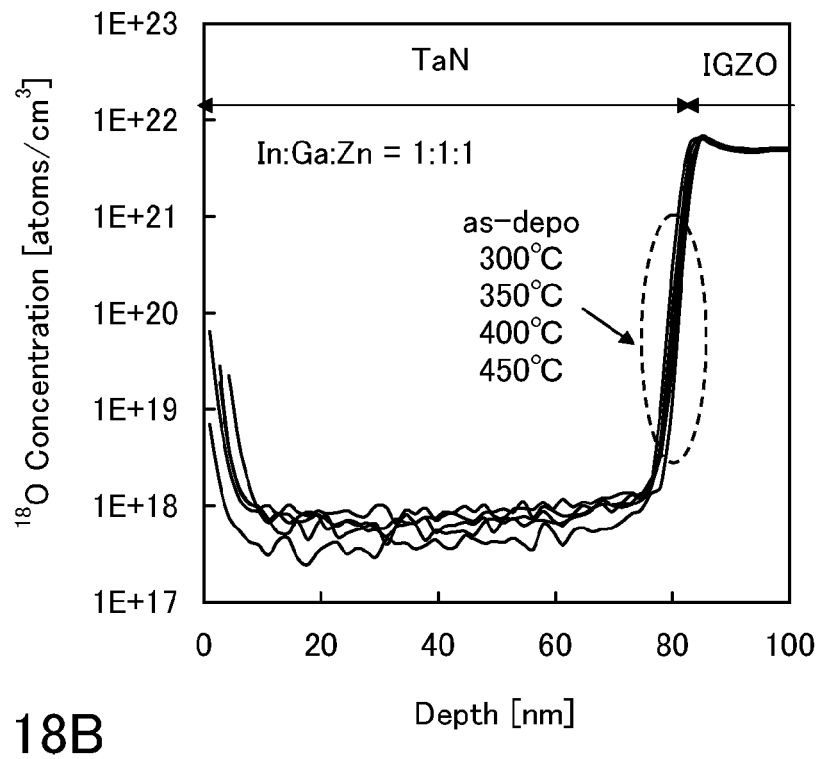
FIGS. 18A and 18B show results of SIMS analysis of a stacked layer including an IGZO film and a tantalum nitride film.
Figure 18B:
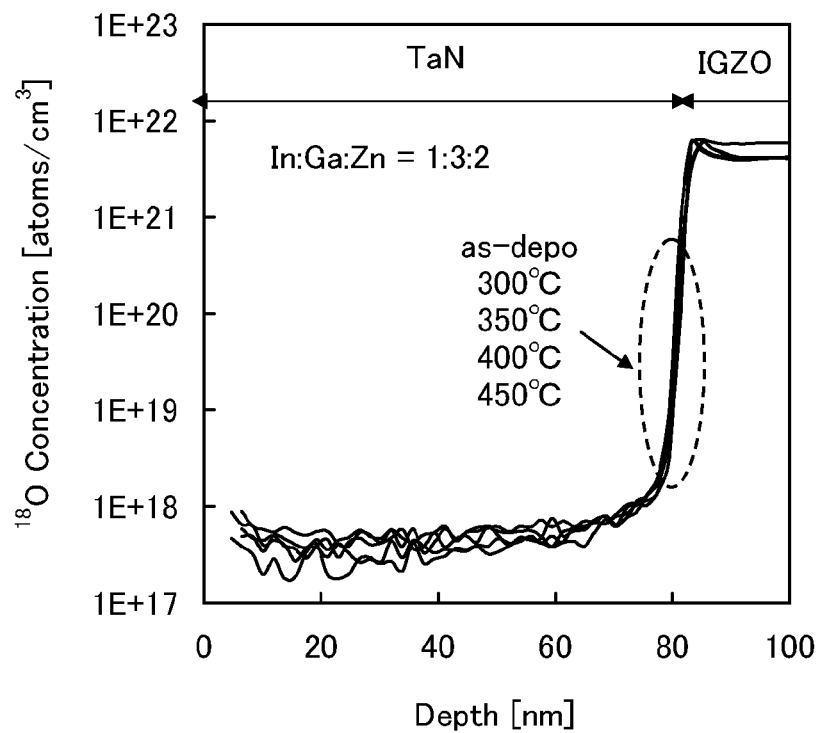

FIGS. 18A and 18B each show the SIMS analysis results in samples which were each fabricated using a tantalum nitride film instead of the tungsten film. The tantalum nitride film was formed by a reactive sputtering method (a DC sputtering method) with a tantalum sputtering target and a deposition gas containing Ar and $N_2$ at a flow rate ratio of 5:1. Note that heat treatment was performed under four conditions similar to the above, and five samples including a sample which was not subjected to heat treatment were compared with one another.

FIG. 18A shows the SIMS analysis results in samples which were each fabricated with a stack of the IGZO film whose atomic ratio of In to Ga and Zn was 1:1:1 and the tantalum nitride film. In any of the samples, transfer of oxygen to the tantalum nitride film was not observed and its behavior was different from that of the sample with the tungsten film in FIG. 17A. FIG. 18B shows the SIMS analysis results in samples which were each fabricated with a stack of the IGZO film whose atomic ratio of In to Ga and Zn was 1:3:2 and the tantalum nitride film. In any of the samples, transfer of oxygen to the tantalum nitride film was not observed and its behavior was different from that of the sample with the tungsten film in FIG. 17B. Accordingly, it can be said that the tantalum nitride film is a film that is not easily bonded to oxygen or a film to which oxygen is not easily transferred.

Figure 19A:
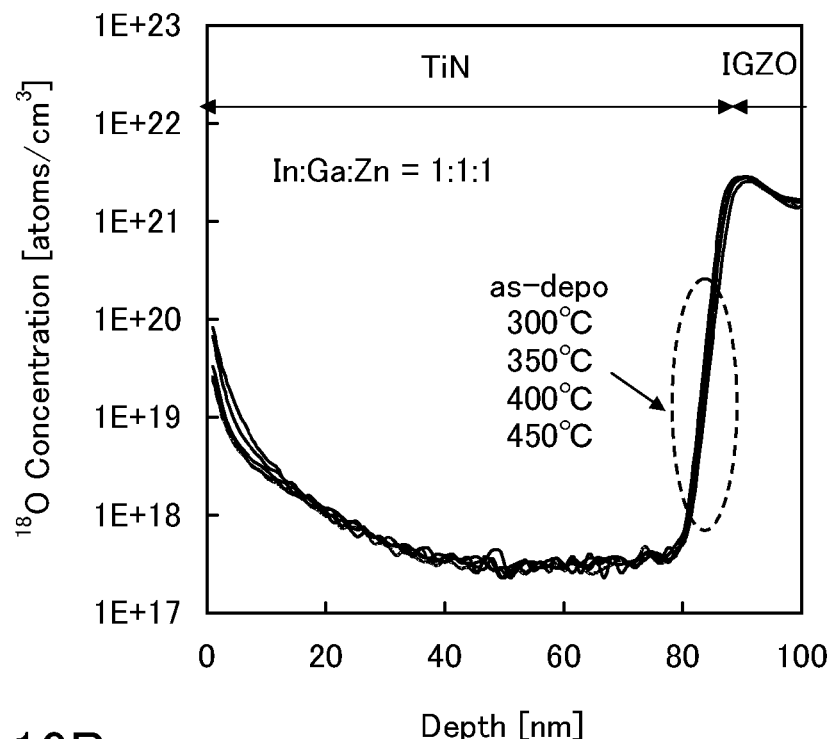
FIGS. 19A and 19B show results of SIMS analysis of a stacked layer including an IGZO film and a titanium nitride film.
Figure 19B:
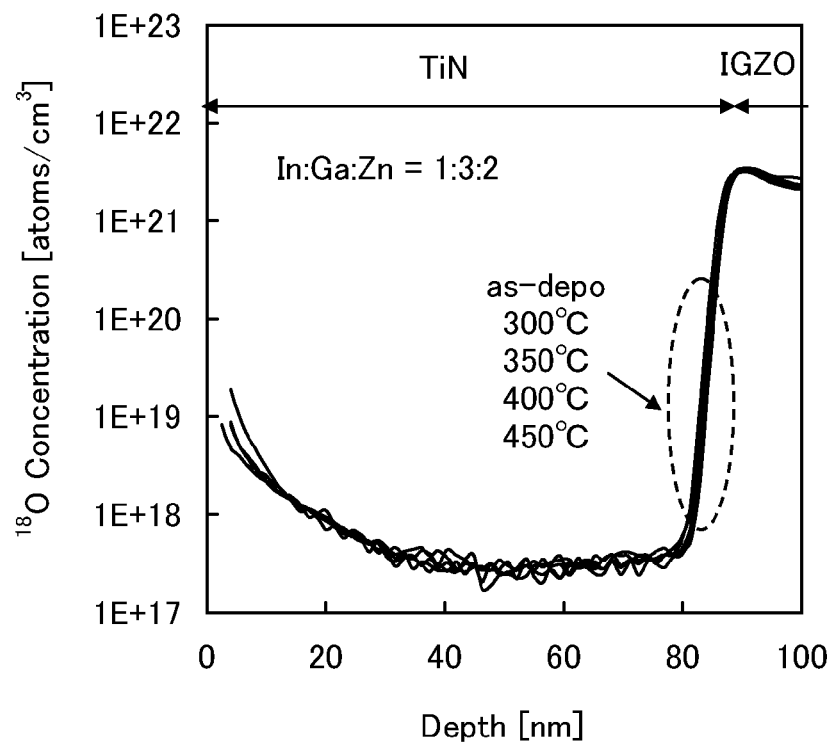

FIGS. 19A and 19B each show the SIMS analysis results in samples which were each fabricated using a titanium nitride film instead of the tungsten film. The titanium nitride film was formed by a reactive sputtering method (a DC sputtering method) with a titanium sputtering target and a 100 percent $N_2$ gas used as a deposition gas. Note that heat treatment was performed under four conditions similar to the above, and five samples including a sample which was not subjected to heat treatment were compared with one another.

FIG. 19A shows the SIMS analysis results in samples which were each fabricated with a stack of the IGZO film whose atomic ratio of In to Ga and Zn was 1:1:1 and the titanium nitride film. In either sample, transfer of oxygen to the titanium nitride film was not observed and its behavior was different from that of the sample with the tungsten film in FIG. 17A. FIG. 19B shows the SIMS analysis results in samples which were each fabricated with a stack of the IGZO film whose atomic ratio of In to Ga and Zn was 1:3:2 and the titanium nitride film. In either sample, transfer of oxygen to the titanium nitride film was not observed and its behavior was different from that of the sample with the tungsten film in FIG. 17B. Accordingly, it can be said that the titanium nitride film is a film that is not easily bonded to oxygen or a film to which oxygen is not easily transferred.

Next, transfer of an impurity to an IGZO film was examined by SIMS analysis, and results thereof are described.

Figure 20A:
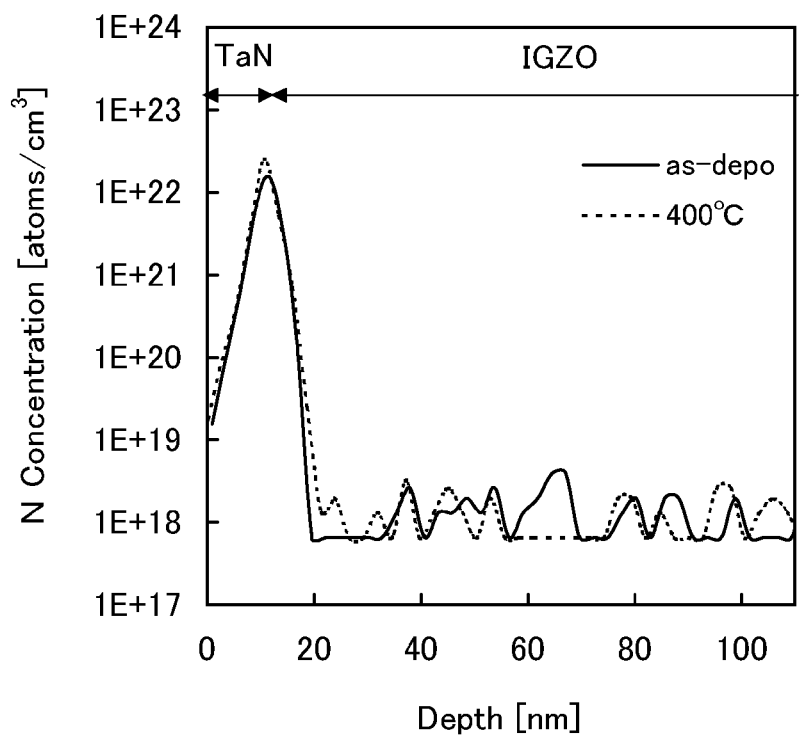
FIGS. 20A and 20B show results of SIMS analysis of a stacked layer including an IGZO film and a tantalum nitride film and a stacked layer including an IGZO film and a titanium nitride film.
Figure 20B:
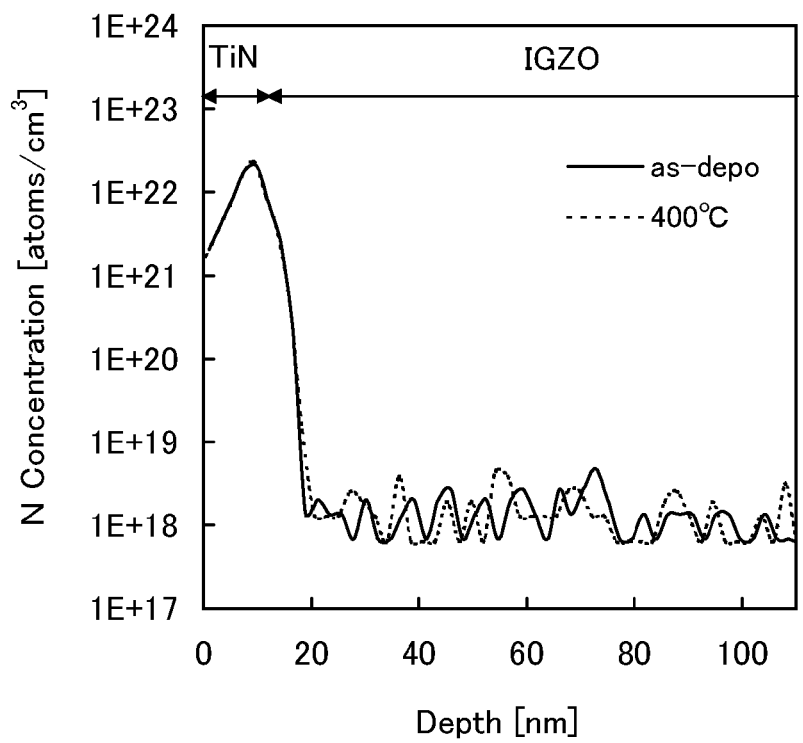

FIGS. 20A and 20B each show SIMS analysis results of profiles of nitrogen in a depth direction before and after heat treatment in samples which were each fabricated with a tantalum nitride film or a titanium nitride film formed over an IGZO film by a sputtering method. Note that the IGZO film was formed by a DC sputtering method with a sputtering target containing In, Ga, and Zn at an atomic ratio of 1:1:1 and a deposition gas containing Ar and $O_2$ at a flow rate ratio of 2:1. The tantalum nitride film and the titanium nitride film were formed by the above method. Note that heat treatment was performed at 400° C. for one hour, and two samples including a sample which was not subjected to heat treatment were compared with each other.

As shown in FIGS. 20A and 20B, in either sample, transfer of nitrogen to the IGZO film was not observed. Therefore, nitrogen which serves as a donor in the IGZO film is not widely transferred to the IGZO film from the tantalum nitride film or the titanium nitride film; accordingly, a channel formation region of the transistor is not made to have n-type conductivity.

Figure 21A:
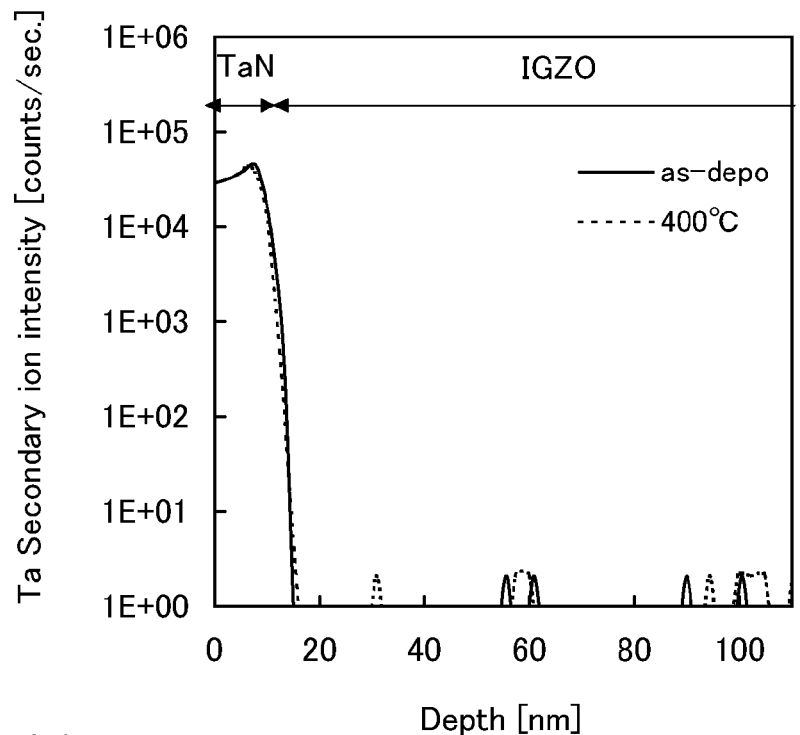
FIGS. 21A and 21B show results of SIMS analysis of a stacked layer including an IGZO film and a tantalum nitride film and a stacked layer including an IGZO film and a titanium nitride film.
Figure 21B:
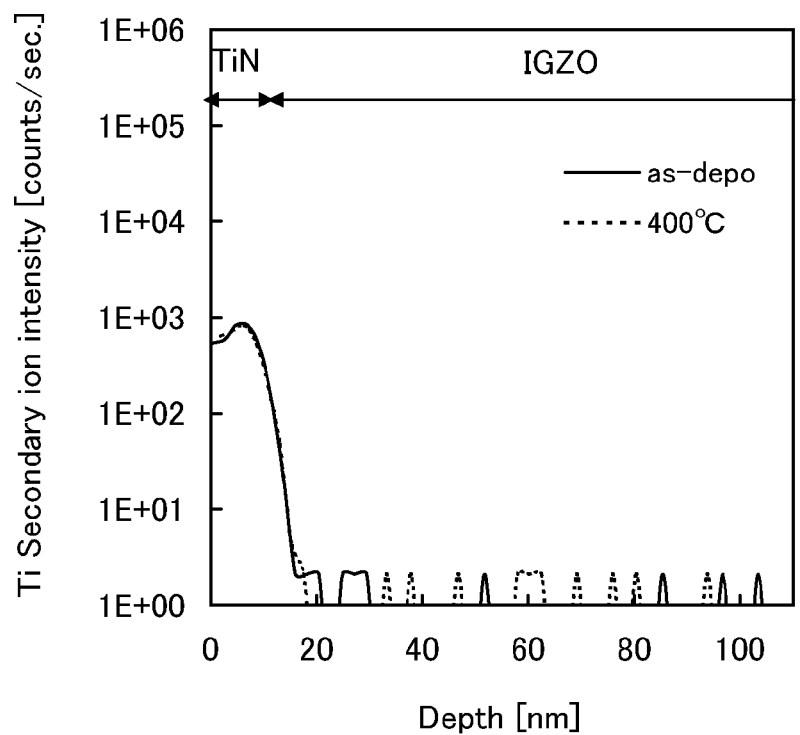

FIGS. 21A and 21B show SIMS analysis results of profiles of tantalum and titanium, respectively, in a depth direction in samples similar to those shown in FIGS. 20A and 20B as examples. As shown in FIGS. 21A and 21B, transfer of tantalum or titanium to the IGZO film was not observed. Accordingly, each of titanium and tantalum which might serve as an impurity affecting the electrical characteristics of the transistor is not widely transferred to the IGZO film from the tantalum nitride film or the titanium nitride film.

The above results showed that a film of a conductive nitride such as tantalum nitride or titanium nitride is a film that is not easily bonded to oxygen or a film to which oxygen is not easily transferred, and nitrogen and a metal element in such a conductive nitride are not easily transferred to the oxide semiconductor film.

Note that this example can be combined as appropriate with any of embodiments or the other example in this specification.

Example 2

In this example, measurement results of sheet resistance values of an oxide semiconductor film after removal of a conductive film which was formed over the oxide semiconductor film will be described.

Figure 22:
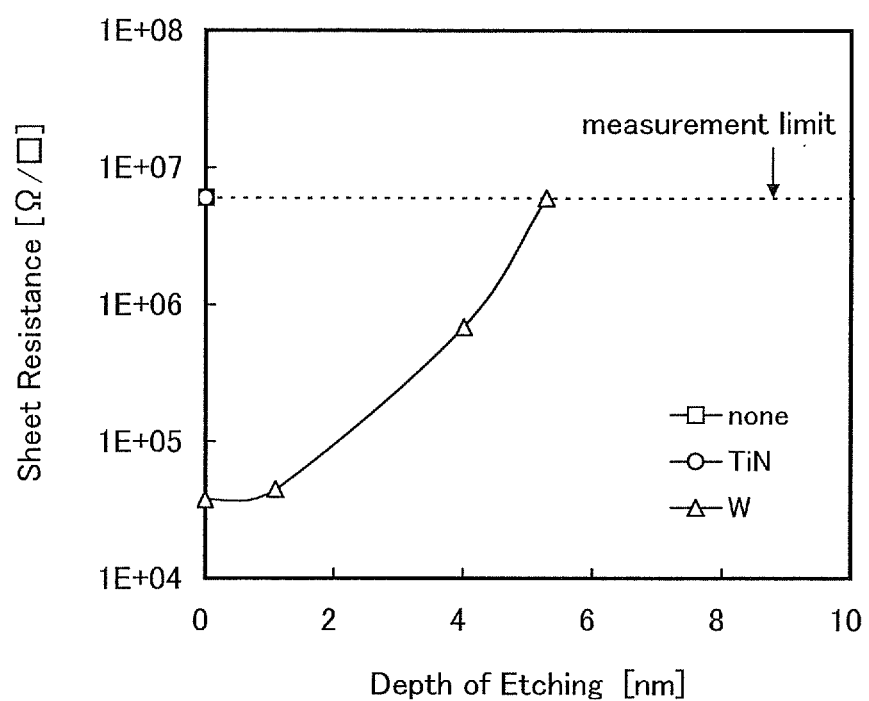
FIG. 22 shows measurement results of sheet resistance values with respect to the depth etching to which an IGZO film is etched.

FIG. 22 shows measurement results of sheet resistance values of samples each fabricated as follows with respect to a depth to which an IGZO film was etched: the IGZO film was formed by a sputtering method, a tungsten film or a titanium nitride film was stacked over the IGZO film by a sputtering method, and then the tungsten film or the titanium nitride film was removed. For comparison, a sample in which a conductive film was not formed over the IGZO film was also fabricated. Note that the IGZO film was formed by a DC sputtering method with a sputtering target containing In, Ga, and Zn at an atomic ratio of 1:1:1 and a deposition gas containing Ar and $O_2$ ($^{18}O$) at a flow rate ratio of 2:1. The tungsten film was formed by a DC sputtering method with a tungsten sputtering target and a 100 percent Ar gas used as a deposition gas. The titanium nitride film was formed by a reactive sputtering method (a DC sputtering method) with a titanium sputtering target and a 100 percent $N_2$ gas used as a deposition gas. The tungsten film and the titanium nitride film were etched using hydrogen peroxide water. The IGZO film was etched using a mixed solution of hydrogen peroxide water and ammonia. The remaining thickness of the IGZO film after the etching was measured using spectroscopic ellipsometry before and after the etching to obtain the depth to which the IGZO film was etched.

In the sample in which the tungsten film was formed over the IGZO film, the resistance of a region of the IGZO film, which was formed to a depth of about 5 nm from the surface of the IGZO film, was reduced as shown in FIG. 22. This suggests that a low-resistant mixed layer of IGZO and tungsten is formed in a region of the IGZO film, which is close to the surface thereof, and that an n-type region is formed due to oxygen vacancies which exist in the above region by transfer of oxygen of the IGZO film to the tungsten film, for example.

On the other hand, in the sample in which the titanium nitride film was formed over the IGZO film and the sample in which a conductive film was not formed over the IGZO film, the resistance of each of the IGZO films was not reduced. This suggests that elements of titanium nitride are not easily transferred to the IGZO film and that oxygen of the IGZO film is not easily transferred to the titanium nitride film, for example.

Figure 23A:
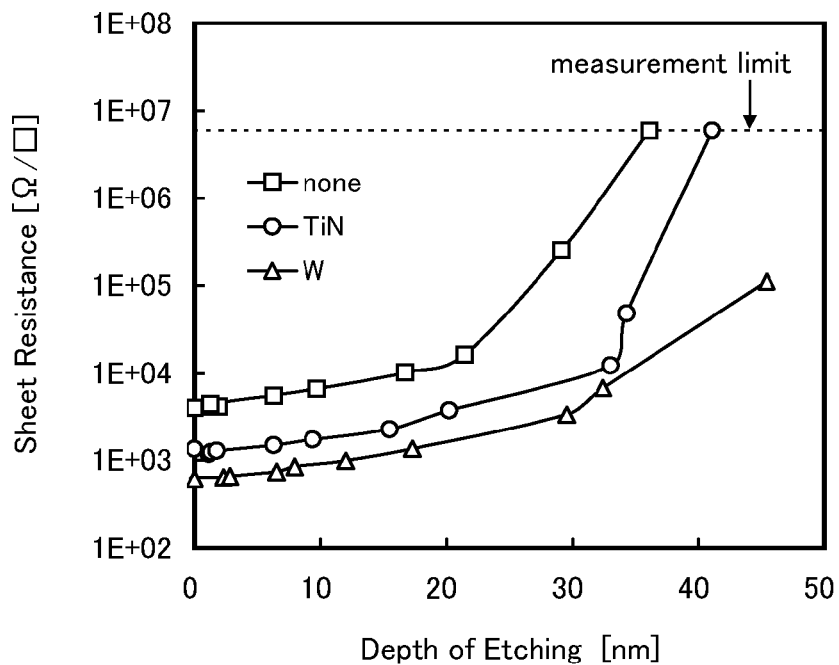
FIGS. 23A and 23B show measurement results of sheet resistance values with respect to the depth to which an IGZO film is etched.

FIG. 23A shows measurement results of sheet resistance values of samples each fabricated as follows with respect to a depth to which an IGZO film was etched: the IGZO film was formed by a sputtering method, a tungsten film or a titanium nitride film was stacked over the IGZO film by a sputtering method, heat treatment was performed, and then the tungsten film or the titanium nitride film was removed. For comparison, a sample in which a conductive film was not formed over the IGZO film was also fabricated. Note that the formation of the IGZO film, and the tungsten film or the titanium nitride film and the removal of the tungsten film or the titanium nitride film were performed in manners similar to those of the above. The heat treatment was performed at 400° C. in a $N_2$ atmosphere for one hour.

As shown in FIG. 23A, in any of the samples, the resistance of the IGZO film was reduced. Here, in the sample in which the tungsten film was formed over the IGZO film, the IGZO film in a region close to a surface thereof has the lowest resistance, and a reduction in resistance proceeded up to the greatest depth as compared with the case of the other samples. This suggests that the tungsten film takes oxygen of the IGZO film thereinto most easily. Further, the behavior of the sample in which the titanium nitride film was formed over the IGZO film was similar to that of the sample in which a conductive film was not formed over the IGZO film. In other words, in the sample in which the tungsten film was formed over the IGZO film, the resistance of the IGZO film was reduced by transfer of oxygen of the IGZO film to the tungsten film, whereas in the sample in which the titanium nitride film was formed over the IGZO film, oxygen released from the IGZO film was transmitted through the titanium nitride film and released to the upper side. This result well accords with the SIMS analysis results shown in Example 1.

Figure 23B:
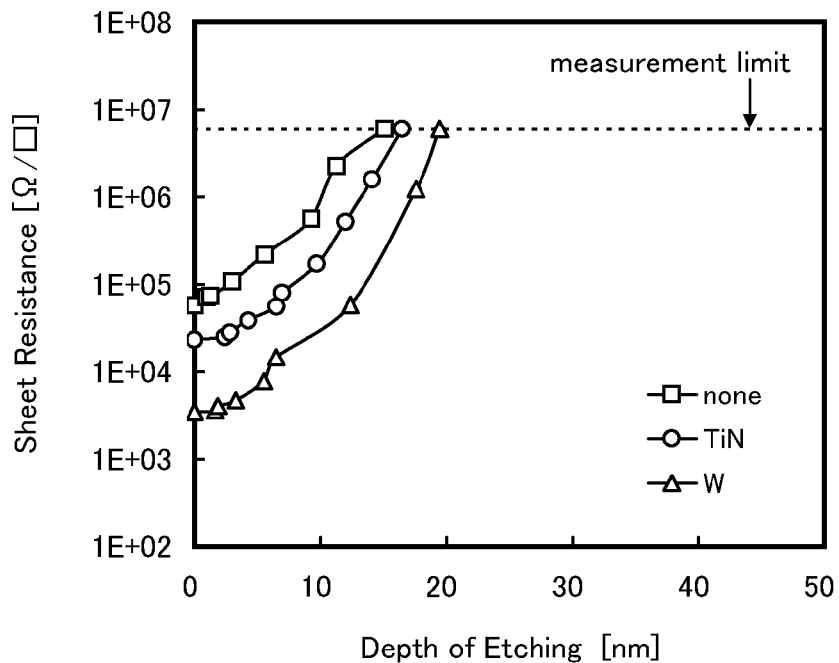

FIG. 23B shows measurement results of sheet resistance values of samples each fabricated as follows with respect to a depth to which an IGZO film was etched: a silicon oxide film was formed by a sputtering method, the IGZO film was formed over the silicon oxide film by a sputtering method, a tungsten film or a titanium nitride film was stacked over the IGZO film by a sputtering method, heat treatment was performed, and then the tungsten film or the titanium nitride film was removed. For comparison, a sample in which a conductive film was not formed over the IGZO film was also fabricated. The silicon oxide film was formed by a reactive sputtering method (a DC sputtering method) with a silicon sputtering target and a 100 percent $O_2$ gas used as a deposition gas. Note that the formation of the IGZO film, and the tungsten film or the titanium nitride film and the removal of the tungsten film or the titanium nitride film were performed in manners similar to those of the above. The heat treatment was performed at 400° C. in a $N_2$ atmosphere for one hour.

As shown in FIG. 23B, low-resistance regions in the IGZO film when seen in a thickness direction were smaller than those observed from the results shown in FIG. 23A. This suggests that oxygen was supplied from the silicon oxide film to the IGZO film by the heat treatment and oxygen vacancies in the IGZO film were reduced; accordingly, the resistance of the IGZO film was increased. With use of a film which is capable of releasing oxygen and provided below the IGZO film in this manner, the thickness of a region of the IGZO film, whose resistance is reduced, can be controlled.

As described above, there were the following findings. A conductive film such as a tungsten film, which easily takes oxygen thereinto, is formed in contact with an IGZO film, so that the resistance of a region of the IGZO film, which is in contact with and close to the conductive film, can be reduced. Moreover, the region of the IGZO film, whose resistance is reduced, can be increased in a depth direction by heat treatment. Further, a film capable of releasing oxygen is formed close to the IGZO film, whereby the thickness of the region whose resistance is reduced can be controlled.

Note that this example can be combined as appropriate with any of embodiments or the other example in this specification.

This application is based on Japanese Patent Application serial no. 2012-230364 filed with Japan Patent Office on Oct. 17, 2012, the entire contents of which are hereby incorporated by reference.

What is claimed is:

1. A method for manufacturing a semiconductor device, including the steps of:
  forming an oxide semiconductor layer;
  forming a first conductive film over the oxide semiconductor layer;
  forming a first source electrode layer and a first drain electrode layer being in contact with the oxide semiconductor layer by a first etching that etches the first conductive film;
  forming a second conductive film over the oxide semiconductor layer, the first source electrode layer, and the first drain electrode layer;
  forming a resist mask over the second conductive film by performing electron beam exposure;
  forming a second source electrode layer and a second drain electrode layer being in contact with the oxide semiconductor layer by a second etching that etches the second conductive film using the resist mask;
  forming a gate insulating film over the oxide semiconductor layer, the second source electrode layer, and the second drain electrode layer;
  forming a gate electrode over the gate insulating film;
  forming a protective insulating film over the gate electrode;
  introducing oxygen into the gate insulating film through the protective insulating film; and supplying the oxygen of the gate insulating film to the oxide semiconductor layer.

2. The method for manufacturing a semiconductor device according to claim 1, wherein the introduction of oxygen into the gate insulating film through the protective insulating film is performed by an ion implantation method.

3. The method for manufacturing a semiconductor device according to claim 1, wherein the second source electrode layer and the second drain electrode layer comprise at least one material selected from tantalum nitride, titanium nitride, and ruthenium.

4. The method for manufacturing a semiconductor device according to claim 1, further comprising the step of:
forming an oxide insulating film before the step of forming the oxide semiconductor layer.

5. The method for manufacturing a semiconductor device according to claim 1, wherein the first source electrode layer and the first drain electrode layer comprise at least one material selected from Al, Cr, Cu, Ta, Ti, Mo, and W.

6. The method for manufacturing a semiconductor device according to claim 4, wherein oxygen is supplied to the oxide semiconductor layer through the oxide insulating film.

7. The method for manufacturing a semiconductor device according to claim 1, further comprising the step of:
introducing oxygen into the gate insulating film before the step of forming the gate electrode.

8. The method for manufacturing a semiconductor device according to claim 1, wherein the oxide semiconductor layer is overlapped with the first source electrode layer, the first drain electrode layer, the second source electrode layer, and the second drain electrode layer.

\* \* \* \* \*